(12) United States Patent
Choi et al.

(10) Patent No.: US 12,014,781 B2
(45) Date of Patent: Jun. 18, 2024

(54) MEMORY DEVICE SUPPORTING INTERLEAVED OPERATIONS AND MEMORY SYSTEM INCLUDING THE SAME

(71) Applicant: SK hynix Inc., Icheon-si (KR)

(72) Inventors: Won Jae Choi, Icheon-si (KR); Jea Won Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 180 days.

(21) Appl. No.: 17/507,326

(22) Filed: Oct. 21, 2021

(65) Prior Publication Data

US 2022/0130464 A1    Apr. 28, 2022

Related U.S. Application Data

(63) Continuation-in-part of application No. 17/244,060, filed on Apr. 29, 2021, now Pat. No. 11,733,921.

(30) Foreign Application Priority Data

Oct. 26, 2020  (KR) ........................ 10-2020-0139606

(51) Int. Cl.
  *G11C 16/14*   (2006.01)
  *G11C 7/10*    (2006.01)
  (Continued)

(52) U.S. Cl.
  CPC ............ *G11C 16/14* (2013.01); *G11C 7/1039* (2013.01); *G11C 16/26* (2013.01); *G11C 16/30* (2013.01)

(58) Field of Classification Search
  CPC ... G06F 3/0683; G11C 16/0483; G11C 16/08; G11C 16/10; G11C 16/16; G11C 16/24;
  (Continued)

(56) References Cited

U.S. PATENT DOCUMENTS 10,114,562 B2   10/2018  Ravimohan et al.
10,515,712 B1*  12/2019  Hsiao .................. G11C 11/4087
(Continued)

FOREIGN PATENT DOCUMENTS

| KR | 101543433 B1    | 8/2015 |
| KR | 1020190089365 A | 7/2019 |
| KR | 1020210046454 A | 4/2021 |

OTHER PUBLICATIONS

Akira Fukuda, Kioxia and WD announce technical outline of ultra-high-speed flash "XL-FLASH" at ISSCC, Mar. 4, 2020, PC Watch.

*Primary Examiner* — Huan Hoang
(74) *Attorney, Agent, or Firm* — WILLIAM PARK & ASSOCIATES LTD.

(57) ABSTRACT

A memory system includes a first memory die including multiple planes each including a plurality of memory cells and a controller configured to perform data communication with the first memory die through a first channel, and transfer at least two commands from among commands for an erase operation, a read operation, a program operation, and a check operation to the first memory die. After transferring an erase command to a plane among the multiple planes, the controller transfers a read command, a program command, or a check command to another plane among the multiple planes while the first memory die performs an erase operation corresponding to the erase command in the plane.

16 Claims, 13 Drawing Sheets

(51) Int. Cl.
*G11C 16/26* (2006.01)
*G11C 16/30* (2006.01)

(58) Field of Classification Search
CPC ..... G11C 16/26; G11C 2216/22; G11C 16/30;
G11C 16/32; G11C 2216/24
See application file for complete search history.

(56) References Cited

U.S. PATENT DOCUMENTS

| | | | |
|---|---|---|---|
| 11,733,921 B2* | 8/2023 | Choi | G11C 16/16 |
| | | | 711/154 |
| 2006/0050314 A1 | 3/2006 | Shiga et al. | |
| 2006/0294295 A1* | 12/2006 | Fukuzo | G06F 13/1673 |
| | | | 711/105 |
| 2012/0179883 A1 | 7/2012 | Ma | |
| 2013/0128675 A1* | 5/2013 | Kim | G11C 7/1063 |
| | | | 365/189.011 |
| 2018/0197967 A1 | 7/2018 | Oh et al. | |
| 2019/0227719 A1* | 7/2019 | Park | G11C 7/1042 |
| 2020/0011959 A1* | 1/2020 | Abou-Rizk | G01S 5/0289 |
| 2020/0151117 A1 | 5/2020 | Um | |
| 2021/0305268 A1 | 9/2021 | Sato | |

* cited by examiner

MEMORY DEVICE SUPPORTING INTERLEAVED OPERATIONS AND MEMORY SYSTEM INCLUDING THE SAME

CROSS-REFERENCE TO RELATED APPLICATION

This application is a continuation-in-part application of U.S. patent application Ser. No. 17/244,060, filed on Apr. 29, 2021, which claims priority under 35 U.S.C. § 119(a) to Korean patent application number 10-2020-0139606 filed on Oct. 26, 2020, in the Korean Intellectual Property Office, the entire disclosure of which is incorporated by reference herein.

BACKGROUND

1. Technical Field

The present disclosure relates to an electronic device, and more particularly, to a memory device and a memory system including the same supporting an interleaving operation mode.

2. Related Art

A memory system is a device that stores data under the control of a host device such as a computer or a smartphone. The memory system may include a memory device in which data is stored and a memory controller controlling the memory device. The memory device is divided into a volatile memory device and a nonvolatile memory device.

A volatile memory device is a device that stores data only when power is supplied and loses the stored data when the power supply is cut off. A volatile memory device includes, for example, static random access memory (SRAM), dynamic random access memory (DRAM), or the like.

A nonvolatile memory device is a device that does not lose data even though power is cut off. A nonvolatile memory device includes, for example, read only memory (ROM), programmable ROM (PROM), electrically programmable ROM (EPROM), electrically erasable and programmable ROM (EEPROM), flash memory, or the like.

BRIEF DESCRIPTION OF THE DRAWINGS

The detailed description herein makes reference to the accompanying drawings wherein like reference numerals refer to like parts throughout the figures.

DETAILED DESCRIPTION

Figure 1:
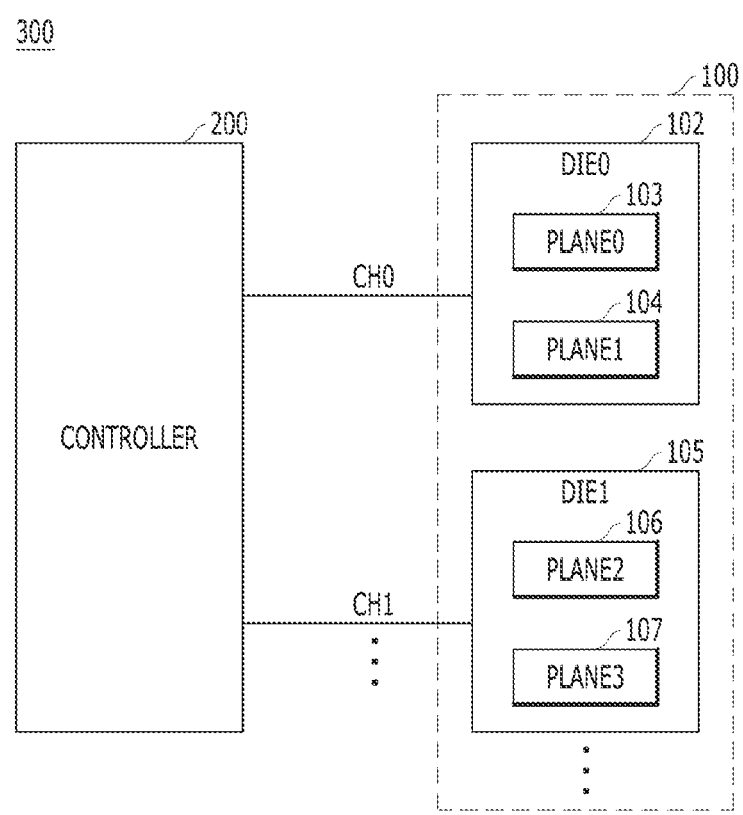
FIG. 1 is a block diagram illustrating a memory system according to an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiments," "an embodiment," "another embodiment," "some embodiments," "various embodiments," "other embodiments," "alternative embodiments," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose a claimed apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware-for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (H) to portions of processor (s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" &so covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

In this specification, an expression that a specific operation is "simultaneously" performed is used, this may mean that some operation times overlap. The expression may mean that a specific operation is "simultaneously" performed with another operation even in a case where time points of the specific operations are different.

Herein, an item of data, a data item, a data entry, or an entry of data may be a sequence of bits. For example, the data item may include the contents of a file, a portion of the file, a page in memory, an object in an object-oriented program, a digital message, a digital scanned image, a part of a video or audio signal, metadata, or any other entity which can be represented by a sequence of bits. According to an embodiment, the data item may include a discrete object. According to another embodiment, the data item may include a unit of information within a transmission packet between two different components.

An embodiment of the disclosure can provide a controller and an operating method of the controller that can reduce a manufacturing cost of the memory system while improving or maintaining performance and reliability of the memory system.

A memory system according to an embodiment of the disclosure can include a memory device including at least one memory die and a controller for controlling the memory device. The memory die can include a plurality of planes, each plane supporting an interleaving operation mode. In the interleaving operation mode, while an erase operation is performed on a plane among the plurality of planes, at least one of a read or program operation or a check operation can be performed on another plane among the plurality of planes. Herein, the check operation can be performed for checking a state of a specific block, a specific page, or a specific plane.

The memory system may read, program, or erase a data item within the memory device in response to a read, program, or erase request input from an external device. Further, the memory system can perform the check operation by itself, regardless of a request input from the external device. The check operation for checking an operating state may be performed periodically or according to an event. To avoid deteriorating data input/output performance of the memory system by interfering with performing an operation corresponding to an externally input request, the memory system can check the operation state of a memory block or a memory page included in a plane, while an erase operation is performed in another plane. Each plane among the plurality of planes can support an interleaving operation mode.

In an embodiment, a memory system can include a first memory die including multiple planes, each plane including a plurality of memory cells; and a controller configured to perform data communication with the first memory die through a first channel, and transfer at least two commands from among commands for an erase operation, a read operation, a program operation, and a check operation to the first memory die. After transferring an erase command to a plane among the multiple planes, the controller can transfer a read command, a program command or a check command to another plane among the multiple planes while the first memory die performs an erase operation corresponding to the erase command in the plane.

The controller can estimate an operation margin of the erase operation performed in the plane and adjusts or changes a sequence of the read command, the program command, or the check command to be transferred to another plane.

The memory system can further include a second memory die, coupled to the controller via a second channel, including multiple other planes. The controller can divide a plurality commands performed in the first memory die and the second memory die into different groups corresponding to the first memory die and the second memory die.

The first memory die can include a voltage generator configured to generate voltages used in the multiple planes; a data buffer and distributor configured to distribute and transfer data input or output via the first channel over the multiple planes via data lines coupled to the multiple planes; and a control circuit configured to control the voltage generator and the data buffer and distributor and output a result of an operation performed in the multiple planes.

The data buffer and distributor can include multiple buffers, each buffer corresponding to each of the multiple planes.

The control circuit can change or adjust an execution sequence of commands input from the controller, to prevent another erase operation from being performed in other planes among the multiple planes while the first memory die performs the erase operation corresponding to the erase command in the plane.

In another embodiment, a memory system can include a first memory die including multiple first planes, each first plane including a plurality of first memory cells; a second memory die including multiple second planes, each second plane including a plurality of second memory cells; and a controller configured to perform data communication with the first and second memory dies through first and second channels. The controller can transfer at least two commands for an erase operation, a read operation, a program operation and a check operation to be performed in the first and second memory dies. While performing an erase operation in a plane of the multiple first planes based on commands input from the controller, the first memory die can perform a read operation, a program operation or a check operation in other planes of the multiple first planes based on the commands.

While performing an erase operation in a plane of the multiple second planes based on other commands input from the controller, the second memory die can perform a read operation, a program operation or a check operation in other planes of the multiple second planes based on the other commands.

The first memory die can include a voltage generator configured to generate voltages used in the multiple first planes; a data buffer and distributor configured to distribute and transfer data input or output via the first channel over the multiple first planes via data lines coupled to the multiple first planes; and a control circuit configured to control the voltage generator and the data buffer and distributor and output a result of an operation performed in the multiple first planes.

The data buffer and distributor can include multiple buffers, each buffer corresponding to each of the multiple first planes.

The control circuit can change or adjust an execution sequence of the commands input from the controller, to prevent another erase operation from being performed in other planes among the multiple first planes, while the first memory die performs the erase operation corresponding to the erase command in the plane among the multiple first planes.

In another embodiment, a memory device can include a plurality of non-volatile memory cells divided into multiple groups; and a control circuit configured to change or adjust an execution sequence of an erase operation, a program operation, a read operation and a check operation performed on the plurality of nonvolatile memory cells, and, while performing an erase operation in a group of the multiple groups, perform a read operation, a program operation or a check operation in other groups of the multiple groups.

The plurality of non-volatile memory cells and the control circuit can be implemented in a single semiconductor chip.

The plurality of non-volatile memory cells and the control circuit can be implemented in different semiconductor chips.

The memory device can further include multiple data buffers and multiple command buffers, each data buffer and each command buffer corresponding to each group of the multiple groups. The control circuit can control input or output of the multiple data buffers and the multiple command buffers to change or adjust the execution sequence.

The multiple data buffers and the multiple command buffers can have a data structure of first-in, first-out (FIFO).

When transmitting or receiving a data buffer among the multiple data buffers, the control circuit can obstruct data transmission/reception in other data buffers among the multiple data buffers.

When a command output from a command buffer among the multiple command buffers is an erase command, the control circuit can check whether an operation performed in the multiple groups is an erase operation to determine whether an operation corresponding to the command is executed.

The control circuit can change or adjust an execution sequence according to whether data transmission/reception is required for operations performed in the multiple groups.

Hereinafter, embodiments of the present disclosure will be described in detail with reference to the accompanying drawings, so that those skilled in the art to which the present disclosure pertains may carry out the technical spirit of the present disclosure.

FIG. 1 illustrates a memory system 300 according to an embodiment of the disclosure. Specifically, FIG. 1 describes interleaving operations performed within a plurality of dies 102, 105 or a plurality of memory planes 103, 104, 106, 107, which is included in a memory device 100 according to an embodiment of the disclosure.

Referring to FIG. 1, a memory system 300 can include a memory device 100 and a controller 200. The controller 200 is also referred to herein as a memory controller. The memory device 100 can include a plurality of memory dies 102, 105, each memory die including a plurality of non-volatile memory cells. The controller 200 connected to the memory device 100 through a data path can control a program operation for a data item in the memory device 100 in response to a request input from an external device, or a read operation for a data item stored in the memory device 100 to output the data item to the external device. Herein, the memory device 100 may be understood as a physical component or element including non-volatile memory cells capable of storing data items. The memory device 100 can be implemented in a form of a package including the plurality of memory dies 102, 105.

The controller 200 and the plurality of memory dies 102, 105 may be coupled through channels CH0, CH1. Each of the plurality of memory dies 102, 105 can include a plurality of planes 103, 104, 106, 107. When multiple memory dies are coupled to the controller 200 via a single channel, the plurality of memory dies are coupled to the controller 200 via different ways. To support an interleaving operation mode, each of the plurality of planes 103, 104, 106, 107 can perform data communication with the controller 200. For example, first and second planes 103, 104 included in the first memory die DIE0 coupled to the controller 200 can share a first channel CH0. The first and second planes 103, 104 can independently perform a data input/output operation to support the interleaving operation mode. Because of sharing the first channel CH0, operations of exchanging data items between the first and second planes 103, 104 and the controller 200 can be performed at different times. According to different embodiments, four or eight planes can be included in the first die DIE0. A plurality of planes can independently or individually perform the data input/output operation, but each plane can transmit and receive a data item to and from the controller 200 at different times.

An erase operation is an example of an operation that the plurality of planes 103, 104, 106, 107 can independently perform. When a read operation is individually performed, a data item stored in each of the plurality of planes 103, 104, 106, 107 can be transferred to the controller 200. In a program operation, a data item to be programmed can be transferred into each of the plurality of planes 103, 104, 106, 107 from the controller 200. That is, the read operation and the program operation can include an operation in which a data item is transmitted/received between the controller 200 and each of the plurality of planes 103, 104, 106, 107, Because a data item is transmitted/received with the controller 200 and because at least some of the plurality of planes 103, 104, 106, 107 can share any one of channels CH0, CH1, data transmission/reception operations performed for read or program operations should be adjusted or controlled to avoid collision or overlapping of data communication between the controller 200 and the plurality of planes 103, 104, 106, 107. However, the data transmission/reception operation might not be required in a case of the erase operation that can be independently performed within each of the planes 103, 104, 106, 107. Accordingly, while the erase operation is performed on the first plane 103 in the first memory die 102, the second plane 104 can freely perform a read or program operation without a control for avoiding collision or overlapping of data transmission/reception operations. Further, in a case when a check operation for checking operation states of multiple memory blocks in the second plane 104, each of the planes 103, 104, 106, 107 can have or secure a longer operation margin for transmitting a result of the check operation to the controller 200.

Although each of the plurality of planes 103, 104, 106, 107 can perform an operation independently, the controller 200 should be able to schedule and transmit multiple operations to each of the plurality of planes 103, 104, 106, 107 for improving data I/O performance of the memory system 300. According to an embodiment, the controller 200 can manage information regarding the multiple operations to be performed on each of the plurality of planes 103, 104, 106, 107. The controller 200 can determine a sequence of performing the multiple operations in the plurality of planes 103, 104, 106, 107, or determine timings of performing the multiple operations to be performed in each of the plurality of planes 103, 104, 106, 107. An erase operation performed in a plane may take longer than another operation such as a check operation, a read operation, or a program operation. While an erase operation is performed in a specific plane, the controller 200 can determine or adjust a sequence for performing other operations in different planes in the same die. Through this interleaving mode determined by the controller 200, performance of the memory device 100 can be improved.

According to an embodiment, a read or program operation can be performed in a plurality of planes rather than in a single plane. In order to quickly program or read a large amount of data into or from the memory device 100, the controller 200 can divide the large amount of data into multiple data items. Each data item can be transferred into different planes, and each plane can perform a program operation individually. When the multiple data items are distributed and stored over multiple planes, each data item can be individually read from each of the multiple planes so that data input/output performance of the memory system 300 can be improved. Unlike a read operation or a program operation, a check operation for checking an operation state regarding a memory block in a specific plane cab be performed independently and individually. For example, a check operation can be performed on a specific plane, while an erase operation is performed on another plane. While the erase operation is performed on a plane, it may be possible for the controller 200 to secure an operation margin for at least one check operation to check an operation state of the memory block in another plane.

According to an embodiment, erase operations might not be simultaneously performed in the plurality of planes 103, 104 included in the same memory die 102. Because the erase operation can use an erase voltage Vers having a higher voltage level than an operation voltage for the read or program operation, multiple erase operations might become unstable when the multiple erase operations are performed simultaneously in the plurality of planes 103, 104. For example, the memory die 102 can include the voltage supply circuit 140 described in FIG. 2. But, the voltage supply circuit 140 might not be included in each of the planes 103, 104, or power consumed form the voltage supply circuit 140 might be not sufficient for performing the multiple erase operations. Because the voltage supply circuit 140 receives a power supply voltage to generate a read voltage Vrd, a program voltage Vprog, a pass voltage Vpass, or an erase voltage Vers, it may be difficult for the voltage supply circuit 140 to manage and control power while generating a plurality of erase voltages Vers to supply the plurality of planes 103, 104. Further, when the erase operations are individually performed based on the erase voltage Vers in the plurality of planes 103, 104, the temperature inside the memory die 102 may rapidly increase, thereby degrading operation safety. As the number of planes included in the memory die 102 increases, it may be difficult to simultaneously perform erase operations over the plurality of planes. For example, when the number of planes included in the memory die 102 is 4 or 8, power management might be difficult if erase operations are performed on multiple planes. When performing a check operation, a program operation, and a read operation on a specific plane while performing an erase operation on another plane, the memory system 300 may achieve more efficient power management, rather than simultaneously performing multiple erase operations performed on multiple planes.

According to an embodiment, the first memory die 102 can include the plurality of planes 103, 104 and be coupled to the controller 200 through a first channel CH0. The first memory die 102 may include a data serializer that transmits a data item for data communication via the first channel CH0 and a data de-serializer that receives a data item. According to an embodiment, to control an operation performed in response to a command transmitted through the controller 200, the first memory die 102 may include a control circuit (e.g., a control logic circuit 160 described in FIG. 3).

In an embodiment, the first memory die 102 may include a plurality of data buffers and a plurality of command buffers. The plurality of data buffers (e.g., the page buffer group 150) and the plurality of command buffers may correspond to each of the plurality of planes 103, 104. The plurality of data buffers and the plurality of command buffers may have a first in first out (FIFO) data structure. The control circuit included in the first memory die 102 can control data input/output of the plurality of data buffers and the plurality of command buffers and adjust or change timings of performing operations on the plurality of planes 103, 104 in the second memory die 102. For example, the control circuit included in the first memory die 102 may schedule the operations to avoid that the plurality of planes 103, 104 perform multiple erase operations simultaneously.

Figure 2:
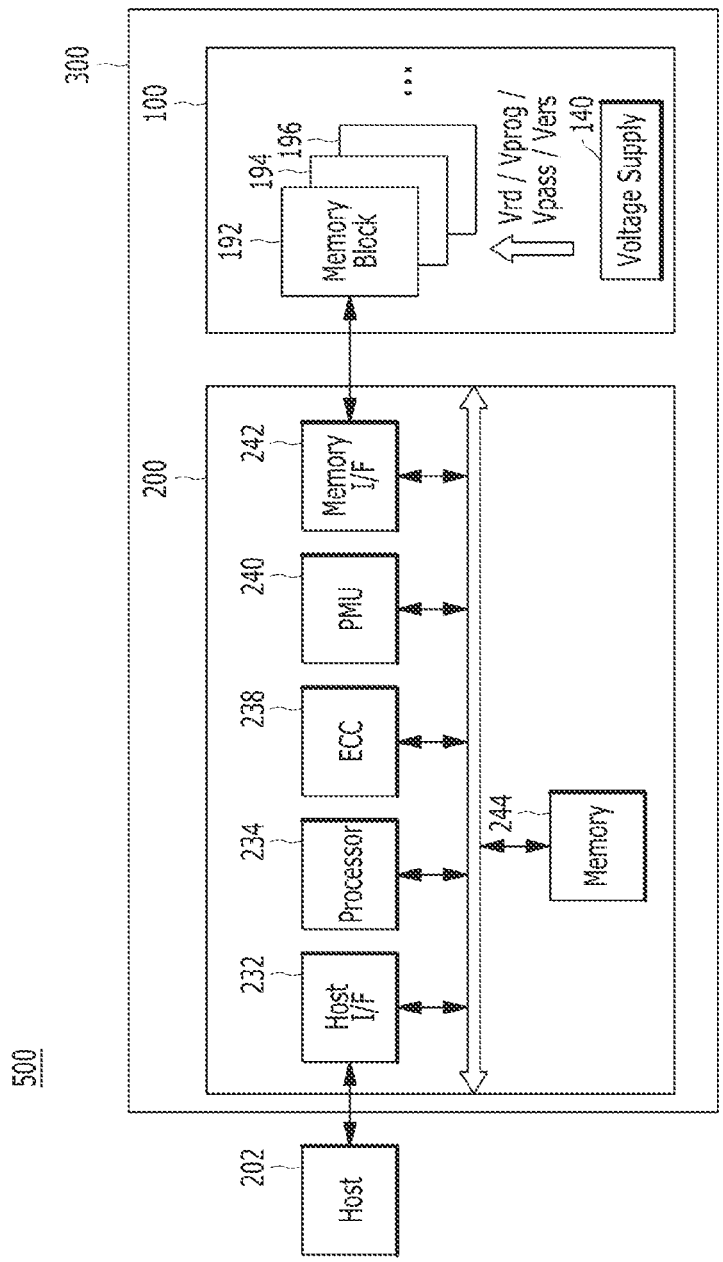
FIG. 2 is a block diagram illustrating a data processing system according to an embodiment of the present disclosure.

FIG. 2 illustrates a data processing system according to an embodiment.

Referring to FIG. 2, the data processing system 500 may include a host 202 engaged or coupled with a memory system, such as memory system 300. For example, the host 202 and the memory system 300 can be coupled to each other via a data bus, a host cable and the like to perform data communication.

The memory system 300 may include a memory device 100 and a controller 200. The memory device 100 and the controller 200 in the memory system 300 may be considered components or elements physically separated from each other. The memory device 100 and the controller 200 may be connected via at least one data path. For example, the data path may include a channel and/or a way.

According to an embodiment, the memory device 100 and the controller 200 may be components or elements functionally divided. Further, according to an embodiment, the memory device 100 and the controller 200 may be implemented with a single chip or a plurality of chips. The controller 200 may perform a data input/output operation in response to a request input from an external device. For example, when the controller 200 performs a read operation in response to a read request input from the external device, data stored in a plurality of non-volatile memory cells included in the memory device 100 is transferred to the controller 200.

As shown in FIG. 2, the memory device 100 may include a plurality of memory blocks 192, 194, 196. The memory blocks 192, 194, 196 may be understood as a group of non-volatile memory cells in which data is removed together by a single erase operation. Although not illustrated, the memory blocks 192, 194, 196 may include a page which is a group of non-volatile memory cells that store data together during a single program operation or output data together during a single read operation. For example, one memory block may include a plurality of pages.

For example, the memory device 100 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 200 through a data path. Each memory die may include an interface to exchange an item of data and a signal with the controller 200.

According to an embodiment, the memory device 100 may include at least one memory block 192, 194, 196, at least one memory plane, or at least one memory die. The internal configuration of the memory device 100 shown in FIG. 1 may be different according to performance of the memory system 300. Embodiments of the present disclosure are not limited to the internal configuration shown in FIG. 2.

Referring to FIG. 2, the memory device 100 may include a voltage supply circuit 240 capable of supplying at least some voltage into the memory blocks 192, 194, 196. The voltage supply circuit 240 may supply a read voltage Vrd, a program voltage Vprog, a pass voltage Vpass, or an erase voltage Vers into a non-volatile memory cell included in the memory blocks 192, 194, 196. For example, during a read operation for reading data stored in the non-volatile memory cell included in the memory blocks 192, 194, 196, the voltage supply circuit 240 may supply the read voltage Vrd into a selected non-volatile memory cell. During the program operation for storing data in the non-volatile memory cell included in the memory blocks 192, 194, 196, the voltage supply circuit 240 may supply the program voltage Vprog into a selected non-volatile memory cell. Also, during a read operation or a program operation performed on the selected nonvolatile memory cell, the voltage supply circuit 240 may supply a pass voltage Vpass into a non-selected nonvolatile memory cell. During the erasing operation for erasing data stored in the non-volatile memory cell included in the memory blocks 192, 194, 196, the voltage supply circuit 240 may supply the erase voltage Vers into the memory block.

The memory device 100 may store information regarding various voltages which are supplied to the memory block 192, 194, 196 based on which operation is performed. For example, when a non-volatile memory cell in the memory blocks 192, 194, 196 can store multi-bit data, multiple levels of the read voltage Vrd for recognizing or reading the multi-bit data item may be required. The memory device 100 may include a table including information corresponding to multiple levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 202 may include a portable electronic device (e.g., a mobile phone, an MP3 player, a laptop computer, etc.) or a non-portable electronic device (e.g., a desktop computer, a game player, a television, a projector, etc.).

The host 202 may also include at least one operating system (OS), which can control functions and operations performed in the host 202. The OS can provide interoperability between the host 202 engaged operatively with the memory system 300 and a user who intends to store data in the memory system 300. The OS may support functions and operations corresponding to user's requests. By the way of example but not limitation, the OS can be classified as a general operating system or a mobile operating system according to mobility of the host 202. A general operating system may be classified as a personal operating system or an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 202 may include a plurality of operating systems. The host 202 may execute multiple operating systems interlocked with the memory system 300, corresponding to a user's request. The host 202 may transmit a plurality of commands corresponding to the user's requests into the memory system 300, thereby performing operations corresponding to the plurality of commands within the memory system 300.

A controller 200 in the memory system 300 may control a memory device 100 in response to a request or a command input from the host 202. For example, the controller 200 may perform a read operation to provide data read from the memory device 100 to the host 202 and may perform a write operation (or a program operation) to store data input from the host 202 in the memory device 100. In order to perform data input/output (I/O) operations, the controller 200 may control and manage internal operations of reading data, programming data, erasing data, or the like.

According to an embodiment, the controller 200 may include a host interface 232, a processor 134, error correction circuitry (ECC) 238, a power management unit (PMU) 240, a memory interface 242, and a memory 244. Components included in the controller 200 as illustrated in FIG. 2 may vary according to structures, functions, operation performance, or the like, regarding the memory system 300.

For example, the memory system 300 may be implemented with any of various types of storage devices, which may be electrically coupled with the host 202, according to a protocol of a host interface. A non-exhaustive list examples of suitable storage devices includes a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 200 according to implementation of the memory system 300.

The host 202 and the memory system 300 each may include a controller or an interface for transmitting and receiving signals, data, and the like, in accordance with one or more predetermined protocols. For example, the host interface 232 in the memory system 300 may include an apparatus capable of transmitting signals, data, and the like to the host 202 or receiving signals, data, and the like from the host 202.

The host interface 232 included in the controller 200 may receive signals, commands (or requests), and/or data input from the host 202. For example, the host 202 and the memory system 300 may use a predetermined protocol to transmit and receive data therebetween. Examples of protocols or interfaces supported by the host 202 and the memory system 300 for sending and receiving data include Universal Serial Bus (USB), Multi-Media Card (MMC), Parallel Advanced Technology Attachment (DATA), Small Computer System Interface (SCSI), Enhanced Small Disk Interface (ESDI), Integrated Drive Electronics (IDE), Peripheral Component Interconnect Express (PCIE), Serial-attached SCSI (SAS), Serial Advanced Technology Attachment (SATA), Mobile Industry Processor Interface (MIDI), and the like. According to an embodiment, the host interface 232 is a kind of layer for exchanging data with the host 202 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 202 and the memory system 300. When a plurality of memory systems 300 are connected to a single host 202, the plurality of memory systems 300 may be divided into a master and a slave by using a position or a dip switch to which the plurality of memory systems 300 are connected. The memory system 300 set as the master may be used as a maim memory device. The IDE (ATA) may include, for example, Fast-ATA, ATAPI, or Enhanced IDE (EIDE).

A Serial Advanced Technology Attachment (SATA) interface is a kind of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 202 used for the data transmission and reception. The SATA interface may connect up to 30 external devices to a single transceiver included in the host 202. In addition, the SATA interface can support hot plugging that allows an external device to be attached to or detached from the host 202, even while data communication between the host 202 and another device is being executed, Thus, the memory system 300 can be connected or disconnected as an additional device, like a device supported by a universal serial bus (USB) even when the host 202 is powered on. For example, in the host 202 having an eSATA port, the memory system 300 may be freely attached to or detached from the host 202 like an external hard disk.

Small Computer System Interface (SCSI) is a kind of serial data communication interface used for connecting a computer or a server with other peripheral devices. The SCSI can provide a high transmission speed, as compared with other interfaces such as IDE and SATA. In the SCSI, the host 202 and at least one peripheral device (e.g., memory system 300) are connected in series, but data transmission and reception between the host 202 and each peripheral device may be performed through a parallel data communication. In the SCSI, it is possible to connect or disconnect a device such as the memory system 300 to or from the host 202. The SCSI can support connections of 15 other devices to a single transceiver included in host 202.

Serial Attached SCSI (SAS) can be understood as a serial data communication version of the SCSI. In the SAS, the host 202 and a plurality of peripheral devices are connected in series, and data transmission and reception between the host 202 and each peripheral device may be performed in a serial data communication scheme. The SAS can support connection between the host 202 and the peripheral device through a serial cable instead of a parallel cable, to manage equipment using the SAS and enhance or improve operational reliability and communication performance. The SAS may support connections of eight external devices to a single transceiver included in the host 202.

The Non-volatile memory express (NVMe) is a kind of interface based at least on a Peripheral Component Interconnect Express (PCIe) designed to increase performance and design flexibility of the host 202, servers, computing devices, and the like equipped with the non-volatile memory system 300. The PCIe can use a slot or a specific cable for connecting a computing device (e.g., host 202) and a peripheral device (e.g., memory system 300). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 300, such as an SSD, that is faster than a hard disk.

According to an embodiment, the host 202 and the memory system 300 may be connected through a universal serial bus (USB). The Universal Serial Bus (USB) is a kind of scalable, hot-pluggable plug-and-play serial interface that can provide cost-effective standard connectivity between the host 202 and peripheral devices such as a keyboard, a mouse, a joystick, a printer, a scanner, a storage device, a modem, a video camera, and the like. A plurality of peripheral devices such as the memory system 300 may be coupled to a single transceiver included in the host 202.

Referring to FIG. 2, the error correction circuitry 238 can correct error bits of data read from the memory device 100, and may include an error correction code (ECC) encoder and an ECC decoder. The ECC encoder may perform error correction encoding of data to be programmed in the memory device 100 to generate encoded data into which a parity bit is added, and store the encoded data in memory device 100. The ECC decoder can detect and correct error bits contained in the data read from the memory device 100 when the controller 200 reads the data stored in the memory device 100. For example, after performing error correction decoding on the data read from the memory device 100, the error correction circuitry 238 determines whether the error correction decoding has succeeded or not, and outputs an instruction signal (e.g., a correction success signal or a correction fail signal), based on a result of the error correction decoding. The error correction circuitry 238 may use a parity bit, which has been generated during the ECC encoding process for the data stored in the memory device 100, in order to correct the error bits of the read data. When the number of the error bits is greater than or equal to the number of correctable error bits, the error correction circuitry 238 might not correct the error bits and instead may output the correction fail signal indicating failure in correcting the error bits.

According to an embodiment, the error correction circuitry 238 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 238 may include all circuits, modules, systems, and/or devices for performing the error correction operation based on at least one of the above described codes.

For example, the ECC decoder may perform hard decision decoding or soft decision decoding on data transmitted from the memory device 100. The hard decision decoding can be understood as one of two methods broadly classified for error correction. The hard decision decoding may include an operation of correcting an error bit by reading digital data of '0' or '1' from a non-volatile memory cell in the memory device 100. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 100 by two or more quantized values (e.g., multiple bit data, approximate values, an analog value, and the like) in order to correct an error bit based on the two or more quantized values. The controller 200 can receive two or more alphabets or quantized values from a plurality of non-volatile memory cells in the memory device 100, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 100 in several bits according to reliability, not simply data of 1 or 0 like the hard decision decoding, and iteratively repeats at through a message exchange in order to improve reliability of the values. Then, the values are finally determined as data of 1 or 0, For example, a decoding algorithm using LDPC codes can be understood as probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping (which may be considered an error that can occur in the memory device 100), the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 240 may control electrical power provided to the controller 200. The PMU 240 may monitor the electrical power supplied to the memory system 300 (e.g., a voltage supplied to the controller 200) and provide the electrical power to components included in the controller 200. The PMU 240 might not only detect power-on or power-off, but might also generate a trigger signal to enable the memory system 300 to back up a current state urgently when the electrical power supplied to the memory system 300 is unstable. According to an embodiment, the PMU 240 may include a device or a component capable of accumulating electrical power that may be used in an emergency.

The memory interface 242 may serve as an interface for handling commands and data transferred between the controller 200 and the memory device 100, in order to allow the controller 200 to control the memory device 100 in response to a command or a request input from the host 202. The memory interface 242 may generate a control signal for the memory device 100 and may process data input to, or output from, the memory device 100 under the control of the processor 134 in a case when the memory device 100 is a flash memory.

For example, when the memory device 100 includes a NAND flash memory, the memory interface 242 includes a NAND flash controller (NFC). The memory interface 242 can provide an interface for handling commands and data between the controller 200 and the memory device 100. In accordance with an embodiment, the memory interface 242 can be implemented through, or driven by, firmware called a Hash Interface Layer (FIL) for exchanging data with the memory device 100.

According to an embodiment, the memory interface 242 may support an open NAND flash interface (ONFi), a toggle mode, or the like, for data input/output with the memory device 100. For example, the ONFi may use a data path (e.g., a channel, a way, etc.) that includes at least one signal line capable of supporting bi-directional transmission and reception in a unit of 8-bit or 16-bit data. Data communication between the controller 200 and the memory device 100 can be achieved through at least one interface regarding an asynchronous single data rate (SDR), a synchronous double data rate (DDR), a toggle double data rate (DDR), or the like.

The memory 244 may be used as a working memory of the memory system 300 or the controller 200, while temporarily storing transaction& data of operations performed in the memory system 300 and the controller 200. For example, the memory 244 may temporarily store read data output from the memory device 100 in response to a read request from the host 202 before the read data is output to the host 202. In addition, the controller 200 may temporarily store write data input from the host 202 in the memory 244 before programming the write data in the memory device 100. When the controller 200 controls operations, such as a data read operation, a data write or program operation, a data erase operation, etc., of the memory device 100, data transmitted between the controller 200 and the memory device 100 of the memory system 300 may be temporarily stored in the memory 244.

In addition to the read data or write data, the memory 244 may store information (e.g., map data, read requests, program requests, etc.) used for inputting or outputting data between the host 202 and the memory device 100. According to an embodiment, the memory 244 may include one or more of a command queue, a program memory, a data memory, a write buffer/cache, a read buffer/cache, a data buffer/cache, a map buffer/cache, and so on. The controller 200 may allocate some storage space in the memory 244 for a component which is established to carry out a data input/output operation. For example, the write buffer established in the memory 244 may be used to temporarily store target data subject to a program operation.

In an embodiment, the memory 244 may be implemented with volatile memory. For example, the memory 244 may be implemented with static random access memory (SRAM), dynamic random access memory (DRAM), or both. Although FIG. 2 illustrates, for example, the memory 244 disposed within the controller 200, embodiments are not limited thereto. The memory 244 may be located within or external to the controller 200. For instance, the memory 244 may be embodied by external volatile memory having a memory interface transferring data and/or signals between the memory 244 and the controller 200.

The processor 134 may control the overall operations of the memory system 300. For example, the processor 134 can control a program operation or a read operation of the memory device 100 in response to a write request or a read request entered from the host 202. According to an embodiment, the processor 134 may execute firmware to control the program operation or the read operation in the memory system 300. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

According to an embodiment, the memory system 300 may be implemented with at least one multi-core processor. The multi-core processor is a kind of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 300 may be improved. According to an embodiment, the data input/output (I/O) operations in the memory system 300 may be independently performed through different cores in the multi-core processor.

The processor 134 in the controller 200 may perform an operation corresponding to a request or a command input from the host 202. Further, the memory system 300 may perform an operation independent from a command or a request input from the host 202. In one case, an operation performed by the controller 200 in response to the request or the command input from the host 202 may be considered a foreground operation, while an operation performed by the controller 200 independently from the request or the command input from the host 202 may be considered a background operation. The controller 200 can perform foreground or background operations for reading, writing, or erasing data in the memory device 100. In addition, a parameter set operation corresponding to a set parameter command or a set feature command as a set command transmitted from the host 202 may be considered a foreground operation. Meanwhile, as a background operation that is performed without a command transmitted from the host 202, the controller 200 can perform garbage collection (GC), wear leveling (WL), bad block management for identifying and processing bad blocks, or the like.

According an embodiment, substantially similar operations may be performed as both the foreground operation and the background operation. For example, when the memory system 300 performs garbage collection in response to a request or a command input from the host 202 (e.g., Manual GC), the garbage collection can be considered a foreground operation. When the memory system 300 performs garbage collection independently of the host 202 (e.g., Auto GC), the garbage collection can be considered a background operation.

When the memory device 100 includes a plurality of dies (or a plurality of chips) each including a plurality of non-volatile memory cells, the controller 200 may perform a parallel processing regarding multiple requests or commands input from the host 202 in order to improve performance of the memory system 300. For example, the transmitted requests or commands may be divided into multiple groups including at least some of a plurality of planes, a plurality of dies, or a plurality of chips included in the memory device 100, and the multiple groups of requests or commands are processed individually or in parallel in each plane, each die or each chip.

The memory interface 242 in the controller 200 may be connected to the plurality of dies or chips in the memory device 100 through at least one channel and at least one way. When the controller 200 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 300 increases by operating with the interleaving method, data I/O performance of the memory system 300 can be improved.

By the way of example but not limitation, the controller 200 can recognize statuses of a plurality of channels (or ways) associated with the plurality of dies included in the memory device 100. The controller 200 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 200 may refer to descriptors delivered from the memory device 100. The descriptors may include a block or page of parameters describing something about the memory device 100. The descriptors can have a predetermined format or structure. For instance, the descriptors may include device descriptors, configuration descriptors, unit descriptors, and the like. The controller 200 may refer to, or use, the descriptors to determine which channel (s) or way(s) is used to exchange an instruction or data.

Referring to FIG. 2, the memory device 100 in the memory system 300 may include a plurality of memory blocks 192, 194, 196. Each of the plurality of memory blocks 192, 194, 196 includes a plurality of non-volatile memory cells. According to an embodiment, the memory blocks 192, 194, 196 can be a group of non-volatile memory cells erased together. The memory blocks 192, 194, 196 may include a plurality of pages, each page being a group of non-volatile memory cells read or programmed together.

In one embodiment, each memory block 152, 154, or 156 may have a three-dimensional stack structure for a high integration. Further, the memory device 100 may include a plurality of dies, each die including a plurality of planes, each plane including the plurality of memory blocks 192, 194, 196. A configuration of the memory device 100 may be changed depending on performance of the memory system 300.

FIG. 2 illustrates the memory device 100 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in a view of storage capacity.

In an embodiment, the memory device 100 may be implemented with MLC memory blocks such as a double-level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 100 can be implemented with a block including a plurality of pages implemented by memory cells, each memory cell capable of storing five or more bits of data.

According to an embodiment, the controller 200 may use an MLC memory block included in the memory device 100 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 200 may perform a data input/output operation with a higher speed when the MLC memory block is used as the SLC memory block. Thus, the controller 200 may use the MLC memory block as a SLC buffer to temporarily store data because the buffer may require a high data input/output speed for improving performance of the memory system 300.

Further, according to an embodiment, the controller 200 can program data in a MLC a plurality of times without performing an erase operation on a specific MLC memory block included in the memory device 100. In general, non-volatile memory cells do not support data overwrite. However, the controller 200 may program 1-bit data in the MLC a plurality of times using a feature in which the MLC is capable of storing multi-bit data. For a MLC overwrite operation, the controller 200 may store the number of program times as separate operation information when 1-bit data is programmed in a MLC. According to an embodiment, an operation for uniformly levelling threshold voltages of the MLCs may be carried out before another 1-bit data is programmed in the same MLCs, each having stored another-bit data.

In an embodiment, the memory device 100 is embodied as a non-volatile memory such as a flash memory, for example, as a NAND flash memory, a NOR flash memory, or the like. In another embodiment, the memory device 100 may be implemented using at least one of phase change random access memory (PCRAM), ferroelectrics random access memory (FRAM), transfer torque random access memory (STT-RAM), and spin transfer torque magnetic random access memory (STT-MRAM), or the like.

Figure 3:
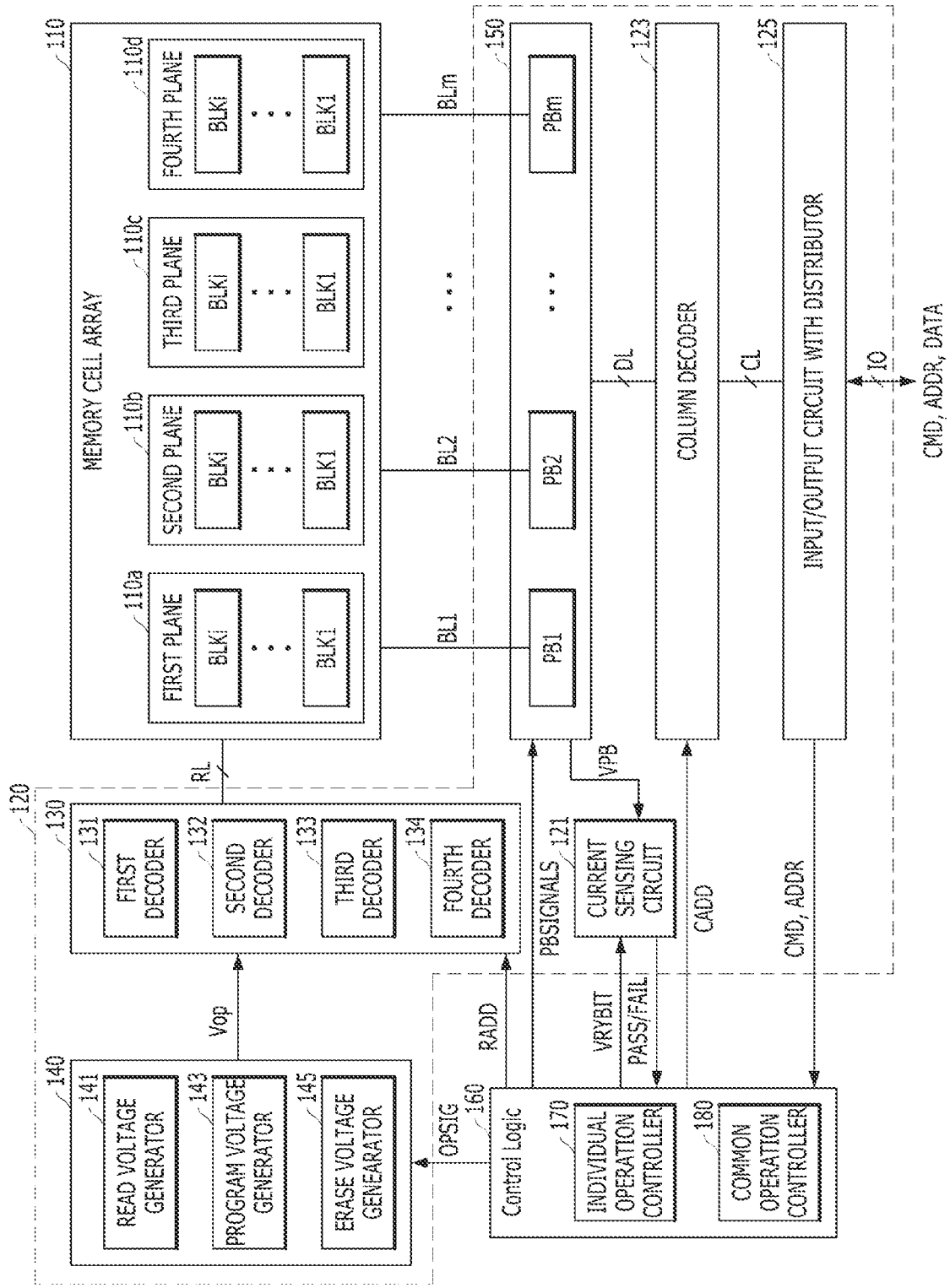
FIG. 3 is a block diagram illustrating a memory device according to an embodiment of the present disclosure.

FIG. 3 is a block diagram illustrating the memory device according to an embodiment of the present disclosure.

Referring to FIG. 3, the memory device 100 may include a memory cell array 110, a peripheral circuit 120, and a control logic circuit 160, which is &so referred to as a control logic or a control circuit.

The memory cell array 110 may include a plurality of planes. In addition, the plurality of planes may include a first plane 110a, a second plane 110b, a third plane 110c, and a fourth plane 110d, Each of the first planes 110a to the fourth planes 110d may include a plurality of memory blocks BLK1 to BLKi. The plurality of memory blocks BLK1 to BLKi included in each plane may be connected to a row decoder 130 corresponding to the respective memory blocks BLK1 to BLKi through the row lines RL. For example, the plurality of memory blocks BLK1 to BLKi included in the first plane 110a may be connected to a first decoder 131 through the row lines RL.

The plurality of memory blocks BLK1 to BLKi may be connected to a page buffer group 150 through bit lines BL1 to BLm. Each of the plurality of memory blocks BLK1 to BLKi may include a plurality of memory cells. In addition, the plurality of memory cells may be nonvolatile memory cells. Memory cells connected to the same word line may be defined as one page. Therefore, one memory block may include a plurality of pages. The row lines RL may include at least one source select line, a plurality of word lines, and at least one drain select line.

Each of the memory cells included in the memory cell array 110 may be configured as an SLC that stores one data bit, an MLC that stores two data bits, a TLC that stores three data bits, or a QLC that stores four data bits.

The peripheral circuit 120 may be configured to perform the program operation, the read operation, or the erase operation on the selected area of the memory cell array 110 under control of the control logic 160. That is, the peripheral circuit 120 may drive the memory cell array 110 under the control of the control logic 160. For example, the peripheral circuit 120 may apply various operation voltages to the row lines RL and the bit lines BL1 to BLn or discharge the applied voltages under the control of the control logic 160. According to an embodiment of the present disclosure, the peripheral circuit 120 may independently perform the read operation, the program operation, or the erase operation on the memory cells included in each of the plurality of planes.

The peripheral circuit 120 may include the row decoder 130, a voltage supply circuit 140, a current sensing circuit 121, a column decoder 123, and an input/output circuit 125 to independently perform the read operation, the program operation, or the erase operation on the memory cells included in each of the plurality of planes. The input/output circuit 125 can include a distributor configured to distribute input data over multiple planes.

The row decoder 130 may include a plurality of decoders corresponding to the plurality of planes. Specifically, the row decoder 130 may include the first decoder 131, a second decoder 132, a third decoder 133, and a fourth decoder 134, and each of the decoders may correspond to the first plane 110a to the fourth plane 110d. The row decoder 130 may be connected to the memory cell array 110 through the row lines RL. According to an embodiment of the present disclosure, the plurality of decoders included in the row decoder 130 may be connected to the plurality of planes, respectively. Specifically, the first decoder 131 may be connected to the plurality of memory blocks BLK1 to BLKi included in the first plane 110a through the row lines RL. In addition, the second decoder 132 may be connected to the plurality of memory blocks BLK1 to BLKi included in the second plane 110b through the row lines RL. The third decoder 133 may be connected to the plurality of memory blocks BLK1 to BLKi included in the third plane 110c through the row lines RL. The fourth decoder 134 may be connected to the plurality of memory blocks BLK1 to BLKi included in the fourth plane 110d through the row lines RL. In addition, the row lines RL may include at least one source select line, a plurality of word lines, and at least one drain select line. In an embodiment, the word lines may include normal word lines and dummy word lines. In addition, the row lines RL may further include a pipe select line.

The row decoder 130 may be configured to operate in response to the control of the control logic 160. The row decoder 130 may receive a row address RADD from the control logic 160. Specifically, the row decoder 130 may be configured to decode the row address RADD. The row decoder 130 may select at least one of the memory blocks BLK1 to BLKz included in the plurality of planes according to a decoded address.

In addition, the row decoder 130 may select at least one word line of the memory block selected to apply the voltages generated by the voltage supply circuit 140 to at least one word line WL according to the decoded address. According to an embodiment of the present disclosure, the row decoder 130 may select any one of the plurality of planes according to the decoded address, and apply the voltages generated by the voltage supply circuit 140 to at least one word line WL by using a decoder corresponding to the selected plane. According to an embodiment of the present disclosure, the row decoder 130 may select the first decoder 131 according to the decoded address, and apply the voltages generated by the voltage supply circuit 140 to the plurality of memory blocks BLK1 to BLKi included in the first plane 110a by using the first decoder 131.

In an embodiment, during the program operation, the row decoder 130 may apply a program voltage to a selected word line and apply a program pass voltage of a level lower than that of the program voltage to an unselected word line. During a program verify operation, the row decoder 130 may apply a verify voltage to the selected word line and a verify pass voltage higher than the verify voltage to the unselected word line. During the read operation, the row decoder 130 may apply a read voltage to the selected word line and apply a read pass voltage higher than the read voltage to the unselected word line.

In an embodiment, the erase operation of the memory cell array 110 may be performed in a memory block unit. During the erase operation, the row decoder 130 may select one memory block according to the decoded address, and the row decoder 130 may apply a ground voltage to word lines connected to the selected memory block.

The voltage supply circuit 140 may operate in response to the control of the control logic 160. Specifically, the voltage supply circuit 140 may be configured to generate a plurality of voltages using an external power voltage supplied to the memory device 100 in response to the control of the control logic 160. For example, the voltage supply circuit 140 may generate the program voltage, the verify voltage, the pass voltage, the read voltage, the erase voltage, and the like in response to the control of the control logic 160. That is, the voltage supply circuit 140 may generate various operation voltages Vop used for the program, read, and erase operations in response to an operation signal OPSIG.

In addition, the voltage supply circuit 140 may generate an internal power voltage by regulating the external power voltage. The internal power voltage generated by the voltage supply circuit 140 may be used as an operation voltage of the memory cell array 110. The voltage supply circuit 140 may generate a plurality of voltages using the external power voltage or the internal power voltage. For example, the voltage supply circuit 140 may include a plurality of pumps that receive the internal power voltage, and may selectively activate the plurality of pumps to generate the plurality of voltages, in response to the control of the control logic 160. In addition, the generated voltages may be supplied to the memory cell array 110 by the row decoder 130.

According to an embodiment of the present disclosure, the voltage supply circuit 140 may include a read voltage generator 141, a program voltage generator 143, and an erase voltage generator 145. The read voltage generator 141 may generate voltages used for the read operation. The program voltage generator 143 may generate voltages used for the program operation. The erase voltage generator 145 may generate voltages used for the erase operation.

The current sensing circuit 121 may generate a reference current in response to a permission bit signal VRYBIT during a read operation or a verify operation, compare a sensing voltage VPB received from the page buffer group 150 and a reference voltage generated by the reference current, and output a pass signal PASS or a fail signal FAIL.

The page buffer group 150 may include first to m-th page buffers PB1 to PBm. The first to m-th page buffers PB1 to PBm may be connected to the memory cell array 110 through the first to m-th bit lines BL1 to BLm, respectively. In addition, the first to m-th page buffers PB1 to PBm may operate in response to the control of the control logic 160.

Specifically, the first to m-th page buffers PB1 to PBm may operate in response to page buffer control signals PBSIGNALS. For example, the first to m-th page buffers PB1 to PBm may temporarily store data received through the first to m-th bit lines BL1 to BLm, or may sense a voltage or a current of the bit lines BL1 to BLm during the read or verify operation.

Specifically, during the program operation, when a program pulse is applied to the selected word line, the first to m-th page buffers PB1 to PBm may transfer data DATA received through the input/output circuit 125 to the selected memory cell through the first to m-th bit lines BL1 to BLm. The memory cells of the selected page may be programmed according to the transferred data DATA. Memory cells of a page selected according to the transferred data DATA may be programmed. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained.

During the program verify operation, the first to m-th page buffers PB1 to PBm may read page data from the selected memory cells through the first to m-th bit lines BL1 to BLm.

During the read operation, the first to m-th page buffers PB1 to PBm may read the data DATA from the memory cells of the selected page through the first to m-th bit lines BL1 to BLm, and output the read data DATA to the input/output circuit 125 under control of the column decoder 123.

During the erase operation, the first to m-th page buffers PB1 to PBm may float the first to m-th bit lines BL1 to BLm.

The column decoder 123 may transfer data between the input/output circuit 125 and the page buffer group 150 in response to a column address CARD. For example, the column decoder 123 may exchange data with the first to m-th page buffers PB1 to PBm through data lines DL, or may exchange data with the input/output circuit 125 through column lines CL.

The input/output circuit 125 may transfer the command CMD and the address ADDR received from the memory controller 200 to the control logic 160, or may exchange the data DATA with the column decoder 123.

The control logic 160 may output the operation signal OPSIG, the row address RADD, the page buffer control signals PBSIGNALS, and the permission bit signal VRYBIT in response to the command CMD and the address ADDR to control the peripheral circuit 120. In addition, the control logic 160 may determine whether the verity operation for the internal operation is passed or failed in response to the pass signal PASS or the fail signal FAIL.

According to an embodiment of the present disclosure, the control logic 160 may include an individual operation controller 170 and a common operation controller 180. In addition, the individual operation controller 170 may control the peripheral circuit 120 to independently perform the read operations on the first plane 110a to the fourth plane 110d. In addition, the common operation controller 180 may control the peripheral circuit 120 to independently perform the program operation and the erase operation on the first plane 110a to the fourth plane 110d. A specific characteristic of the individual operation controller 170 and the common operation controller 180 is described in detail with reference to FIG. 4.

Figure 4:
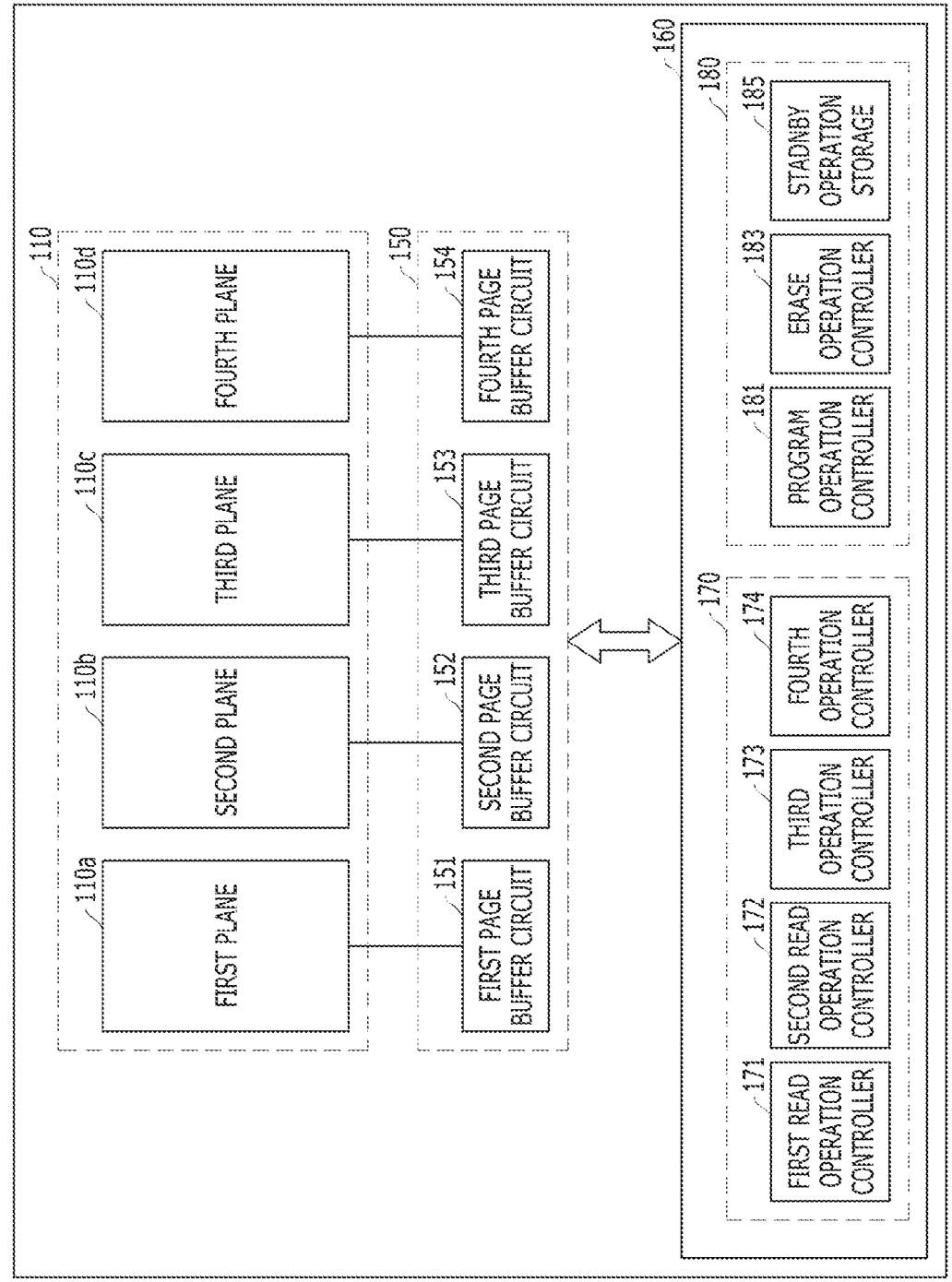
FIG. 4 is a block diagram illustrating a specific operation of a control logic circuit according to an embodiment of the present disclosure.

FIG. 4 is a block diagram illustrating a specific operation of a control logic circuit according to an embodiment of the present disclosure.

Referring to FIG. 4, the memory device 100 including the memory cell array 110, the page buffer group 150, and the control logic 160 is shown.

The memory cell array 110 and the page buffer group 150 may be divided into the memory cell array 110 and a plurality of page buffer circuits connected through the bit line BL. That is, the memory cell array 110 and the page buffer group 150 may be paired and operate in one plane unit. For example, the first plane 110a and a first page buffer circuit 151 may form a pair and operate in a plane unit, the second plane 110b and a second page buffer circuit 152 may form a pair and operate in a plane unit, the third plane 110c and a third page buffer circuit 153 may form a pair and operate in a plane unit, and the fourth plane 110d and a fourth page buffer circuit 154 may form a pair and operate in a plane unit. The memory cell array 110 and the plurality of page buffer circuits included in the memory device 100 may be divided into a plurality of corresponding pairs, and each of the pairs may independently operate in one unit.

The control logic 160 may include the individual operation controller 170 and the common operation controller 180. In addition, the control logic 160 may control the peripheral circuit 120 to independently perform the read operation, the program operation, or the erase operation on the memory cells included in each of the plurality of planes using the individual operation controller 170 and the common operation controller 180. For example, the control logic 160 may control to perform the read operation on the first plane 110a and the second plane 110b using the individual operation controller 170.

The individual operation controller 170 may include a first read operation controller 171 to a fourth read operation controller 174. The individual operation controller 170 may control the peripheral circuit 120 to independently perform the read operation for each plane using the first read operation controller 171 to the fourth read operation controller 174. Specifically, the read operation controllers included in the individual operation controller 170 may respectively correspond to the plurality of planes, and each of the read operation controllers may control the read operation performed on the corresponding planes.

For example, the first read operation controller 171 may correspond to the first plane 110a and may control the read operation performed on the first plane 110a. The second read operation controller 172 may correspond to the second plane 110b and may control the read operation performed on the second plane 110b. The third read operation controller 173 may correspond to the third plane 110c and may control the read operation performed on the third plane 110c. The fourth read operation controller 174 may correspond to the fourth plane 110d and may control the read operation performed on the fourth plane 110d.

Because the individual operation controller 170 respectively controls the read operations performed on each of the plurality of planes, the read operations may be independently performed for each plane.

The common operation controller 180 may include a program operation controller 181, an erase operation controller 183, and a standby operation storage 185.

The program operation controller 181 may control the peripheral circuit 120 to independently perform the program operation on the plurality of planes. Specifically, the program operation controller 181 may control the program operations performed on the first plane 110a to the fourth plane 110d using the peripheral circuit 120. In addition, the program operation controller 181 may control the peripheral circuit 120 so that the program operation is independently performed regardless of whether another internal operation (for example, the erase operation or the read operation) is performed.

The program operation controller 181 may control the memory cell array 110 and the peripheral circuit 120 to simultaneously start the program operations performed on two or more planes. For example, the program operation controller 181 may control the first page buffer circuit 151 and the second page buffer circuit 152 to simultaneously start the program operation on the first plane 110a and the second plane 110b.

The erase operation controller 183 may control the peripheral circuit 120 to independently perform the erase operation on the plurality of planes. Specifically, the erase operation controller 183 may control the erase operations performed on the first plane 110a to the fourth plane 110d using the peripheral circuit 120. In addition, the erase operation controller 183 may control the peripheral circuit 120 so that the erase operation is independently performed regardless of whether another internal operation (for example, the program operation or the read operation) is performed.

The erase operation controller 183 may control the memory cell array 110 and the peripheral circuit 120 to simultaneously start the erase operations performed on two or more planes. For example, the erase operation controller 183 may control the first page buffer circuit 151 and the second page buffer circuit 152 to simultaneously start the erase operation on the first plane 110a and the second plane 110b.

The standby operation storage 185 may store an input program command when the program operation controller 181 is operating. Alternatively, the standby operation storage 185 may store an input erase command when the erase operation controller 183 is operating. Specifically, when the program operation is in progress, the program operation controller 181 may start another program operation after the program operation that is in progress is ended. In addition, when the erase operation is in progress, the erase operation controller 183 may start another erase operation after the erase operation that is in progress is ended. The standby operation storage 185 may store a program command input while the program operation is performed, and may store an erase command input while the erase operation is performed. In addition, when a subsequent command instructing the program operation is input while the program operation is performed, the standby operation storage 185 may hold the start of the program operation corresponding to the subsequent command. In addition, when a subsequent command instructing the erase operation is input while the erase operation is performed, the standby operation storage 185 may hold the start of the erase operation corresponding to the subsequent command.

Meanwhile, when a subsequent command instructing the erase operation or the read operation is input while the program operation is performed, the control logic 160 may control the peripheral circuit 120 to perform the erase operation or the read operation corresponding to the subsequent command. In addition, when a subsequent command instructing the program operation or the read operation is input while the erase operation is performed, the control logic 160 controls the peripheral circuit 120 to perform the program operation or the read operation corresponding to the subsequent command. In addition, when a subsequent command instructing the program operation, the erase operation, or the read operation is input while the read operation is performed, the control logic 160 may control the peripheral circuit 120 to perform the program operation, the erase operation, or the read operation corresponding to the subsequent command.

Figure 5:
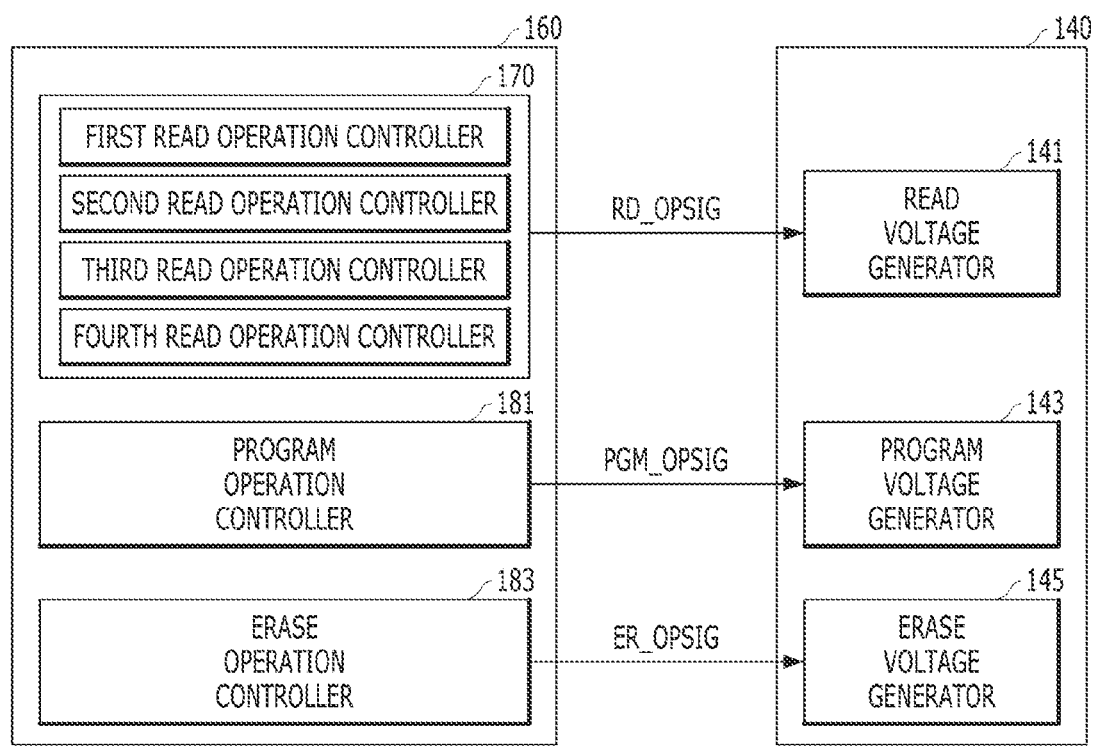
FIG. 5 is a block diagram illustrating a specific operation of a voltage generation circuit according to an embodiment of the present disclosure.

FIG. 5 is a block diagram illustrating a specific operation of a voltage generation circuit according to an embodiment of the present disclosure.

Referring to FIG. 5, the voltage supply circuit 140 including a read voltage generator 141, a program voltage generator 143, and an erase voltage generator 145 is shown.

The voltage supply circuit 140 may operate in response to the control of the control logic 160 including the individual operation controller 170 and the common operation controller 180. Specifically, the read voltage generator 141 may generate the voltages used for the read operation in response to a read operation signal RD_OPSIG of the first to fourth read operation controllers included in the individual operation controller 170. As described with reference to FIG. 4, the first to fourth read operation controllers included in the individual operation controller 170 may be configurations for controlling the read operation performed in each plane, and the read voltage generator 141 may generate the voltages used for the read operation performed on the first plane 110a in response to the read operation signal RD_OPSIG of the first operation controller 171. In addition, the read voltage generator 141 may generate the voltages used for the read operation performed on the second plane 110b to the fourth plane 110d in response to the read operation signal RD_OPSIG of the second read operation controller 172 to the fourth read operation controller 174.

The program voltage generator 143 may generate the voltages used for the program operation in response to control of the program operation controller 181. Specifically, the program operation controller 181 may be a configuration for independently controlling the program operation, and the program voltage generator 143 may independently generate the voltages used for the program operation in response to a program operation signal PGM_OPSIG of the program operation controller 181. That is, the program voltage generator 143 may independently generate the voltages used for the program operation regardless of whether another internal operation (for example, the erase operation or the read operation) is performed.

The erase voltage generator 145 may generate the voltages used for the erase operation in response to control of the erase operation controller 183. Specifically, the erase operation controller 183 may be a configuration for independently controlling the erase operation, and the erase voltage generator 145 may independently generate the voltages used for the erase operation in response to an erase operation signal ER_OPSIG of the erase operation controller 183. That is, the erase voltage generator 145 may independently generate the voltages used for the erase operation regardless of whether another internal operation (for example, the program operation or the read operation) is performed.

Figure 6:
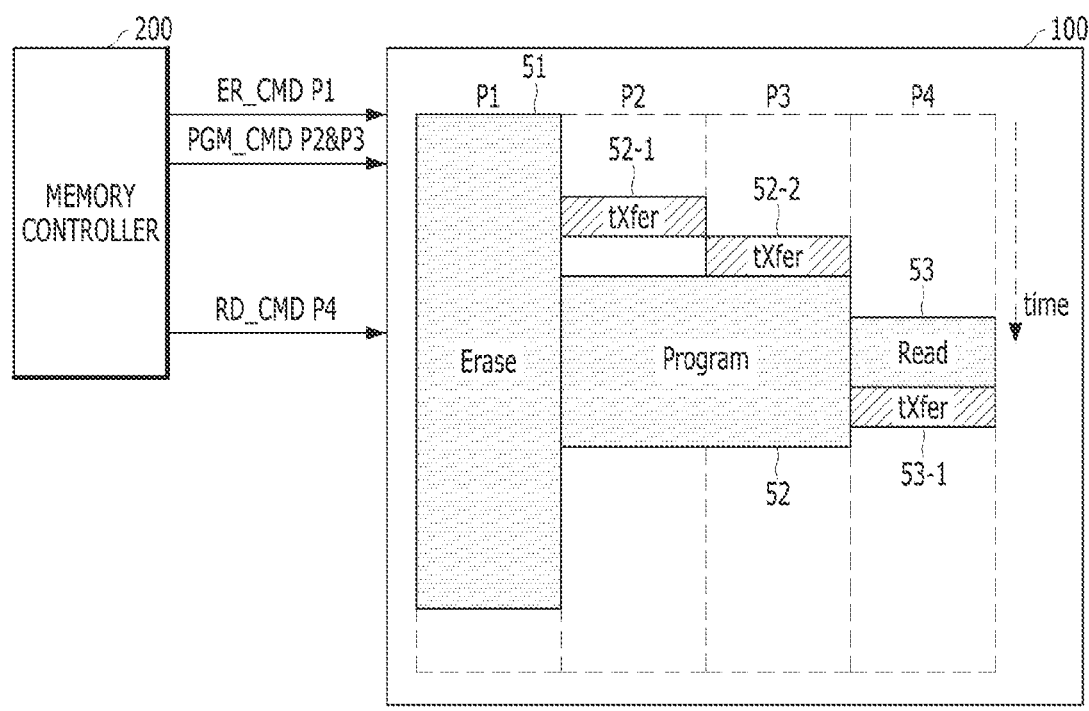
FIG. 6 is a diagram illustrating an internal operation of a memory device according to an embodiment of the present disclosure.

FIG. 6 is a diagram illustrating an internal operation of a memory device according to an embodiment of the present disclosure.

Referring to FIG. 6, the internal operation performed in the memory device 100 when the erase command, the program command, and the read command are sequentially input from the memory controller 200 is shown over time.

When a subsequent command instructing the internal operation (for example, the program operation or the read operation) is input from the memory controller 200 to the memory device 100 while the memory device 100 performs the erase operation, the memory device 100 may simultaneously perform the erase operation and the internal operation corresponding to the subsequent command.

Specifically, the memory device 100 may receive an erase command ER CMD P1 from the memory controller 200. In addition, the memory device 100 may perform an erase operation 51 on the first plane in response to the input command. In addition, when a subsequent command PGM CMD P2&P3 is input from the memory controller 200 while the memory device 100 performs the erase operation 51, the memory device 100 may simultaneously perform the erase operation 51 and a program operation 52.

Meanwhile, the memory device 100 may simultaneously start the program operations or the erase operations performed on two or more planes. After sequentially receiving data to be written in two or more planes to each page buffer circuit, the memory device 100 may simultaneously start performance of the program operation. For example, the memory device 100 may receive a program command PGM CMD P2&P3 for the second plane and the third plane from the memory controller 200. In addition, in response to the input command, the memory device 100 may store data for the second plane in the second page buffer circuit and may store data for the third plane in the third page buffer circuit. After all data for each plane is input, the memory device 100 may simultaneously start performance of the program operation on the second plane and the third plane. Here, tXfer may mean a time when data is input/output to the memory device 100 through the input/output circuit 125. The plurality of planes may share the input/output circuit 125 to sequentially input/output data for each plane.

In FIG. 6, for convenience of description, the program operations performed on two or more planes are shown, but the erase operations performed on two or more planes may be performed by the same method.

While the memory device 100 performs the erase operation 51 and the program operation 52, when a subsequent command RD CMD P4 is input, the memory device 100 may simultaneously perform the erase operation 51, the program operation 52, and a read operation 53 on the fourth plane.

Figure 7:
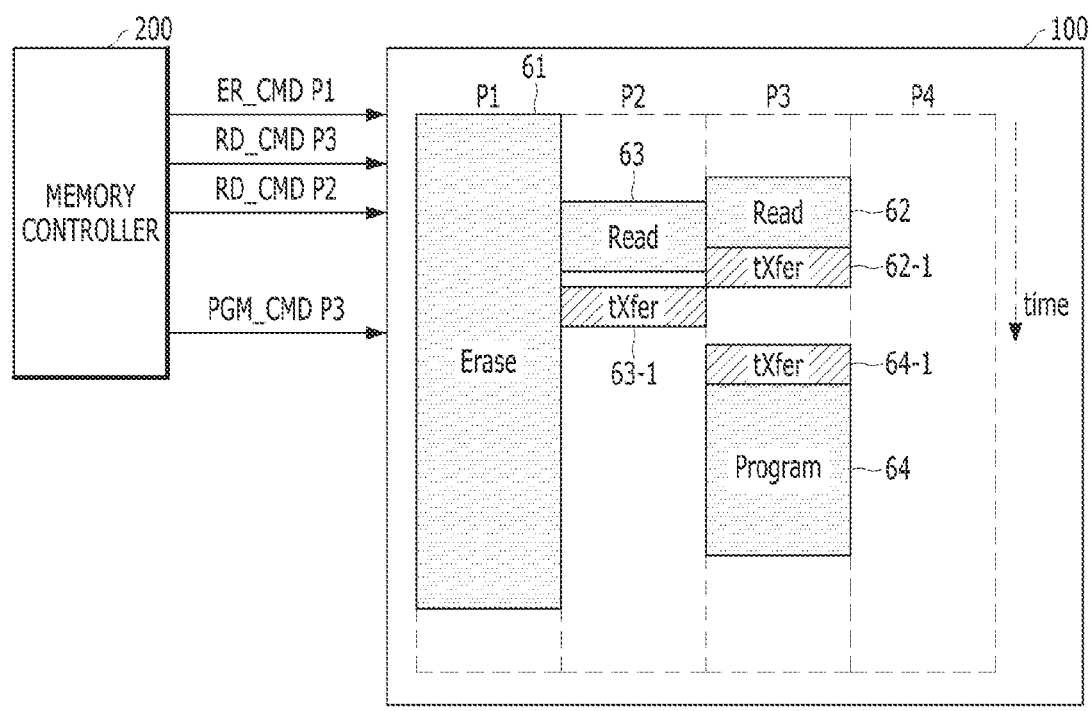
FIG. 7 is a diagram illustrating an internal operation of a memory device according to another embodiment of the present disclosure.

FIG. 7 is a diagram illustrating an internal operation of a memory device according to another embodiment of the present disclosure.

Referring to FIG. 7, the internal operation performed in the memory device 100 when the erase command, a plurality of read commands, and the program command are sequentially input from the memory controller 200 is shown over time.

The memory device 100 may receive the erase command ER CMD P1 from the memory controller 200. In addition, the memory device 100 may perform an erase operation 61 on the first plane in response to the input command. In addition, when a subsequent command RD CMD P3 is input from the memory controller 200 while the memory device 100 performs the erase operation 61, the memory device 100 may simultaneously perform the erase operation 61 and a read operation 62.

Meanwhile, the memory device 100 may simultaneously perform the read operations on two or more planes. The memory device 100 may include a plurality of read operation controllers for each plane, and may individually control the read operations on each plane using the plurality of read operation controllers. For example, the memory device 100 may perform the read operation 62 in response to the read command RD CMD P3 for the third plane input from the memory controller 200. In addition, when a read command RD CMD P2 is input while the memory device 100 performs the read operation 62, the memory device 100 may simultaneously perform the read operation 62 on the third plane and a read operation 63 on the second plane. The memory device 100 may output data read from the third plane using the input/output circuit 125 (62-1) and may sequentially output data read from the second plane (63-1).

While the memory device 100 performs the erase operation 61, when a subsequent command PGM CMD P3 is input, the memory device 100 may simultaneously perform the erase operation 61 and a program operation 64 on the third plane.

Figure 8:
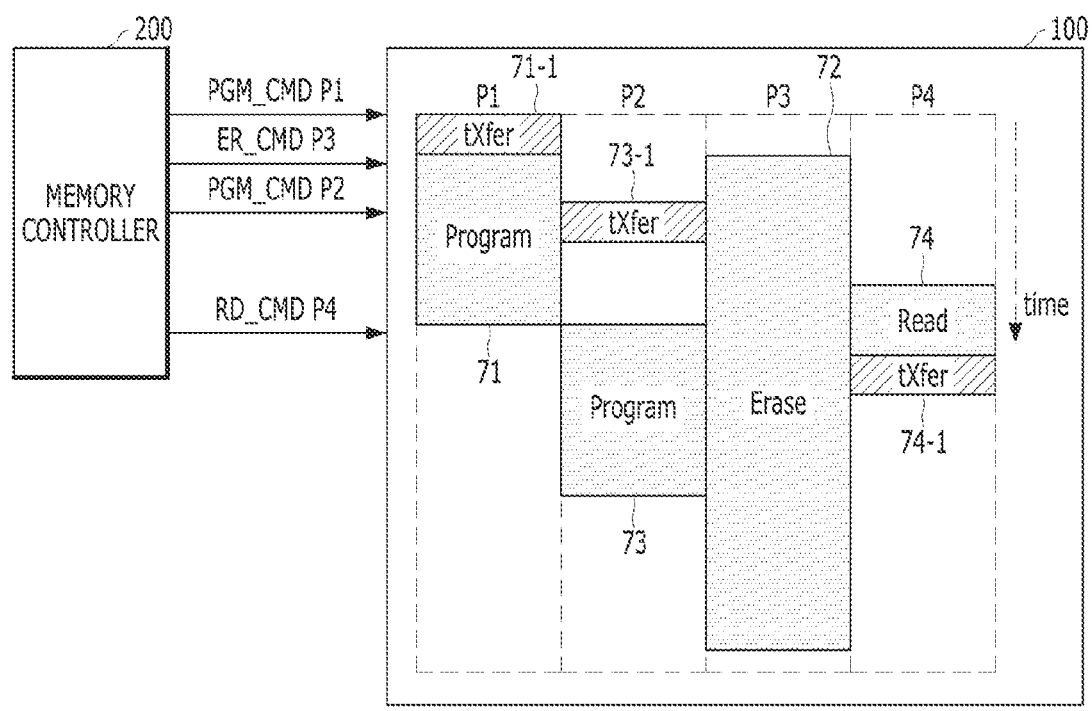
FIG. 8 is a diagram illustrating an internal operation of a memory device according to another embodiment of the present disclosure.

FIG. 8 is a diagram illustrating an internal operation of a memory device according to another embodiment of the present disclosure.

Referring to FIG. 8, the internal operation performed in the memory device 100 when a plurality of program commands, the erase command, and the read command are sequentially input from the memory controller 200 is shown over time.

When a subsequent command instructing the program operation is input from the memory controller 200 to the memory device 100 while the memory device 100 performs the program operation, the memory device 100 may hold the start of the program operation corresponding to the subsequent command.

Specifically, the memory device 100 may receive a program command PGM CMD P1 from the memory controller 200. In addition, after receiving data 71-1, the memory device 100 may perform a program operation 71 on the first plane. When a subsequent command PGM CMD P2 is input from the memory controller 200 while the memory device 100 performs the program operation 71, the memory device 100 may hold the start of the program operation 73 according to the subsequent command. In addition, because the memory device 100 performs the program operation according to an input order, the memory device 100 may perform the program operation 73 according to the subsequent command PGM CMD P2 when the operating program operation 71 is ended. Meanwhile, the memory device 100 may store the subsequent command PGM CMD P2 input during the program operation 71 in the standby operation storage 185. In addition, when the operating program operation 71 is ended, the subsequent command PGM CMD P2 stored in the standby operation storage 185 may be returned to the program operation controller 181, and the program operation 73 may be performed.

Because the program operation and the erase operation or the read operation may be simultaneously performed, when the memory device 100 receives an erase command ER CMD P3 and a read command RE CMD P4 while performing the program operation 71, the memory device 100 may simultaneously perform the program operation 71, an erase operation 72, and a read operation 74.

In FIG. 8, for convenience of description, a case where a subsequent program command is input during a current program operation is shown, but the same method may be applied to a case where a subsequent erase command is input during a current erase operation.

Hereinafter, multiple operations performed in the memory device 100 according to a sequence of commands transmitted from the controller 130 will be described with reference to FIGS. 9 to 13.

Figure 9:
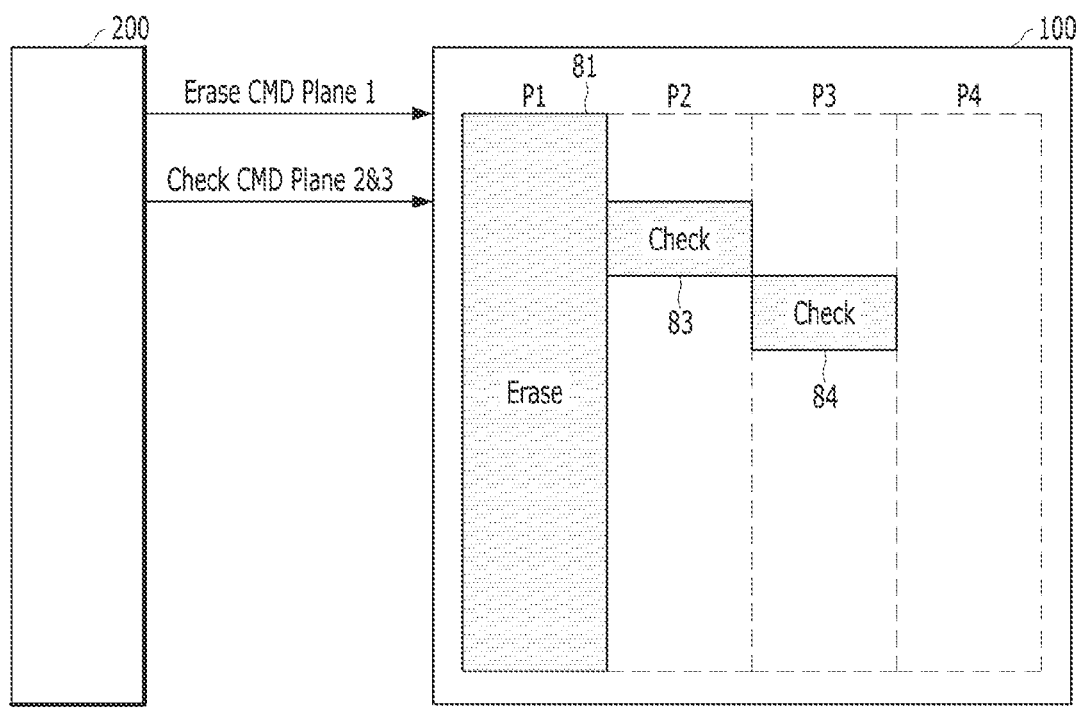
FIG. 9 is a diagram for describing an internal operation of a memory device according to another embodiment of the present disclosure.

FIG. 9 is a diagram for describing internal operations performed in a memory device according to another embodiment of the present disclosure.

In FIG. 9, a top to bottom direction of the diagram including blocks or arrows can represent time. For example, a block size (e.g., a vertical length (from top to a bottom) of solid line block in a first plane P1) shows an operation margin for an erase operation performed in the first plane P1. A length of block of solid line block in a second plane P2 shows an operation margin for a check operation performed in the second plane P2.

Referring to FIG. 9, the memory device 100 can include a single memory die. The memory die can include four planes P1, P2, P3, P4. The controller 200 can transmit an erase command (Erase CMD Plane1), which is for an erase operation to be performed in a first plane P1, into the memory device 100, as well as check commands (Check CMD Plane 2&3), which are for check operations to be performed in a second plane P2 and a third plane P3, into the memory device 100. In FIG. 9, a first arrow for the erase command (Erase CMD Plane1) can represent a first timing, while a second arrow for the check commands (Check CMD Plane 2&3) can represent a second timing. Because the first arrow is shown above the second arrow in the vertical direction of FIG. 9, the first timing is earlier than the second timing.

The memory device 100 might not perform the check operations in the second plane P2 and the third plane P3 after performing the erase operation in the first plane P1, because the check operations and the erase operation would be performed on different planes. The memory device 100 can perform the check operations 83, 84 in the second plane P2 and the third plane P3, while performing the erase operation 81 in the first plane P1. Because the check operations 83, 84 may have a shorter operation margin than the erase operation 81, the check operations 83, 84 can be completed faster than the erase operation 81 performed in the first plane P1 even though the check operations 83, 84 are sequentially performed in the second plane P2 and the third plane P3. When the check operations 83, 84 are sequentially performed in the second plane P2 and the third plane P3, electrical loads on the voltage supply circuit 140 included in the memory device 100 might be reduced.

Figure 10:
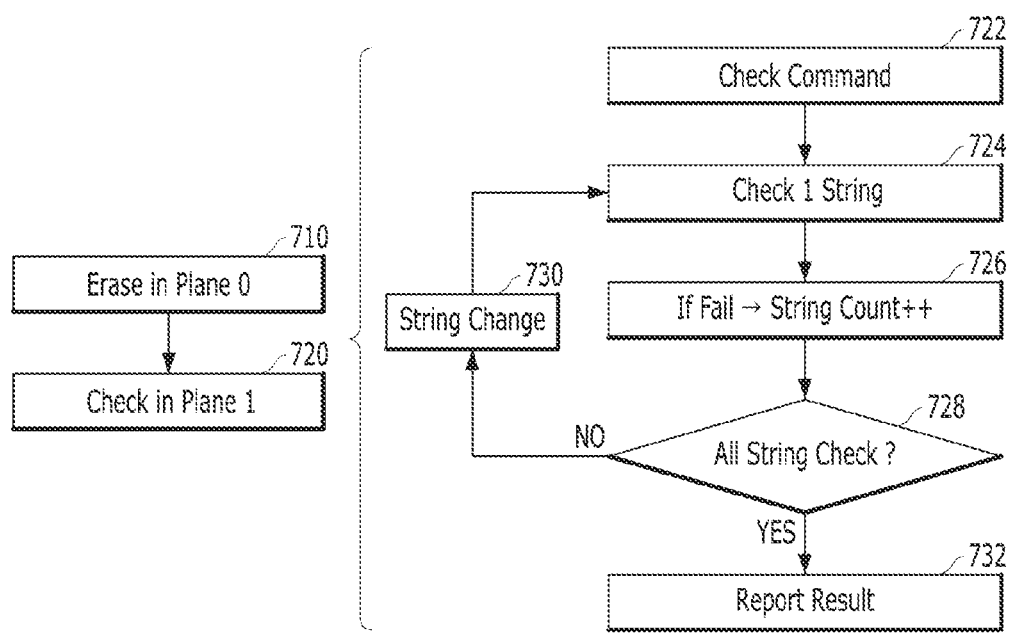
FIG. 10 illustrates a method for operating a memory device according to another embodiment of the present disclosure.

FIG. 10 illustrates a method for operating a memory device according to another embodiment of the present disclosure. Specifically, as shown in FIG. 9, FIG. 10 describes an example in which a check operation is performed in a specific plane while an erase operation is performed in another plane in the memory device.

Referring to FIG. 10, the method for operating the memory device can include performing an erase operation in the first plane P1 (operation 710) and performing a check operation in the second plane P2 (operation 720). The operation 720 of performing the check operation in the second plane P2 can include receiving a check command (operation 722), performing the check operation on a single string (operation 724), and increasing a failure string count based on whether a result of the check operation fails (operation 726).

Further, the operation 720 of performing the check operation in the second plane P2 can include checking whether all strings in the second plane P2 are checked (operation 728), and changing a string (operation 730) when all the strings have not been checked (NO for operation 728). The memory device can perform a check operation on the changed string in the second plane P2 (the operation 724).

The operation 720 of performing the check operation in the second plane P2 can include reporting a result of the check operation (operation 732) if all strings in the second plane P2 have been checked (YES for operation 728). The result of the check operation can include the number of strings, e.g., the failure string count, in which the check operation fails among the strings included in the second plane P2.

According to an embodiment, the memory device can determine whether the failure string count is smaller than a preset reference. If the failure string count is equal to or greater than the preset reference, the memory device can determine that an operation state of a position where the check operation is performed is not good or bad (e.g., unusable, defective, or faulty). On the other hand, when the failure string count is smaller than the preset reference, the memory device can determine that the operation state of the position where the check operation is performed is good (e.g., usable, or healthy).

Herein, a string may be understood as a group of non-volatile memory cells which are serially connected to each other and coupled to a single bit line. For example, each of the memory blocks 192, 194, 196 described with reference to FIG. 2 may include at least one string. According to an embodiment, the check operation may be performed in a unit of string(s). When the failure string count is equal to or greater than the preset reference, the memory device may determine that the integrity or safety of data item(s) stored in the corresponding location or the corresponding area is low (e.g., at might be plausible that the data item(s) has/have an error). In this case, the memory device can send the result of the check operation to the controller 200, so that the controller 200 can migrate the data item(s) stored in the corresponding location or the corresponding area into another location in the memory device, regardless of a command input from the external device (e.g., the host 202).

According to an embodiment, the controller 200 may migrate or move a data item stored at a specific location in the plane to another location in the same plane or another plane according to the result of the check operation performed on the specific location. Data migration controlled by the controller 200 can include several operations such as a read operation, a program operation, and a map data update. It might be difficult for the controller 200 and the memory device 100 to perform the several operations for data migration within a specific plane or between planes, while the memory device performs an erase operation in another plane. However, when a data input/output operation is not performed on a specific plane while an erase operation is performed on another plane, the memory device 100 may perform a string-based check operation on the specific plane. Through the string-based check operation, the memory device 100 can improve or enhance the integrity or safety of data items stored therein without degrading data input/output performance of the memory device.

Figure 11:
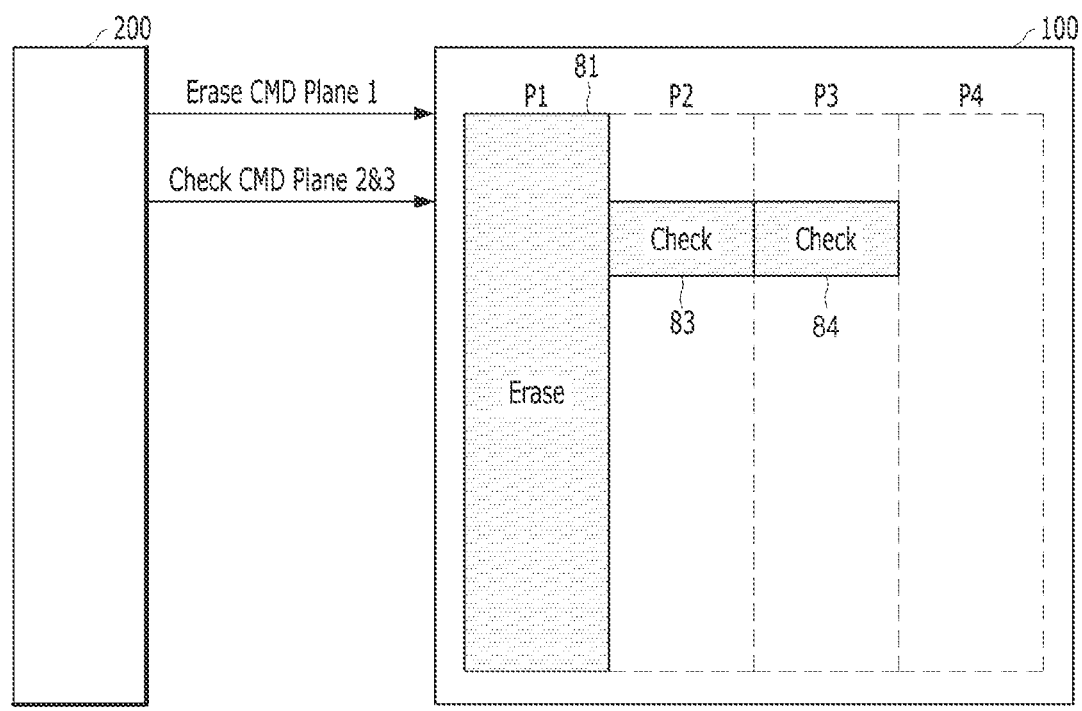
FIG. 11 is a diagram for describing an internal operation of a memory device according to another embodiment of the present disclosure.

FIG. 11 is a diagram for describing internal operations performed in a memory device according to another embodiment of the present disclosure.

Referring to FIG. 11, the memory device 100 may receive the same commands, as in FIG. 10, from the controller 200. The memory device 100 might not perform the check operations in the second plane P2 and the third plane P3 after performing the erase operation in the first plane P1, because the check operations and the erase operation would be performed on different planes. The memory device 100 can simultaneously perform the check operations 83, 84 in the second plane P2 and the third plane P3, individually, while performing the erase operation 81 in the first plane P1. Because the check operations 83, 84 may have a shorter operation margin than the erase operation 81, the check operations 83, 84 can be completed faster than the erase operation 81 performed in the first plane P1. When there is no significant effect on the electrical loads of the voltage supply circuit 140 included in the memory device 100, the check operations 83, 84 can be simultaneously performed in the second plane P2 and the third plane P3. The memory device can be in a waiting state to perform another action while performing the erase operation 81 on the first plane P1.

Figure 12:
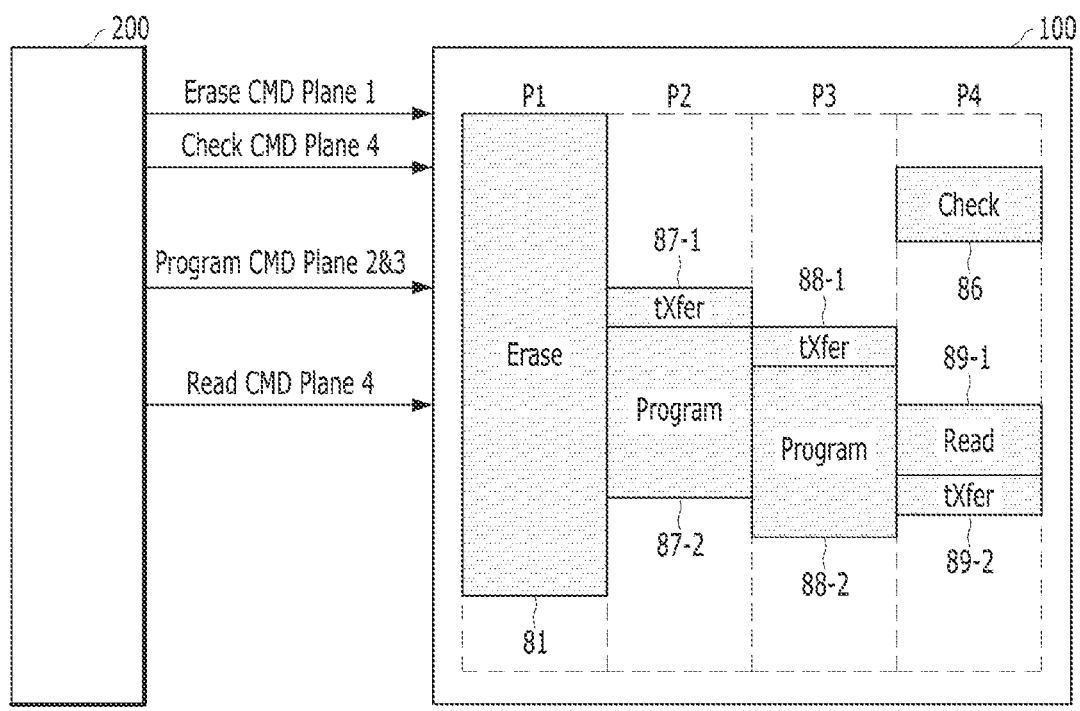
FIG. 12 is a diagram for describing an internal operation of a memory device according to another embodiment of the present disclosure.

FIG. 12 is a diagram for describing an internal operation of a memory device according to another embodiment of the present disclosure.

Referring to FIG. 12, the controller 200 can transmit an erase command (Erase CMD Plane1), which is for an erase operation to be performed in the first plane P1, into the memory device 100. Further, the controller 200 can transfer another command for a check operation (Check CMD Plane 4) to be performed in the fourth plane P4, another command (Program CMD Plane 2&3) for a program operation to be performed in the second plane P2 and the third plane P3, and another command (Read CMD Plane 4) for a read operation to be performed in the fourth plane P4.

While the erase operation 81 is performed in the first plane P1, the memory device 100 may perform operations corresponding to other commands in the second to fourth planes P2, P3, P4 in which the erase operation 81 is not being performed. While the erase operation 81 is performed in the first plane P1, a check operation 86 may be performed in the fourth plane P4. In addition, in response to the command (Program CMD Plane 2&3) for the program operation to be performed in the second plane P2 and the third plane P3, data items to be programmed in the second plane P2 and the third plane P3 can be received sequentially 87-1, 88-1 and then the memory device 100 can program the data items in the second plane P2 and the third plane P3. When the four planes P1, P2, P3, P4 are included in a single memory die, data transfer operations 87-1, 88-1 for sequentially transmitting and receiving the data items because the four planes share the same channel. After sequentially receiving the data items, the memory device 100 may perform program operations 87-2, 88-2 in the second plane P2 and the third plane P3. Also, after the check operation 86 is completed in the fourth plane P4, the memory device 100 can perform a read operation 89-1 in response to a command (Read CMD Plane 4) for the read operation to be performed in the fourth plane P4. Then, a data item read by the read operation 89-1 can be transmitted to the controller 200 through another data transfer operation 89-2.

Figure 13:
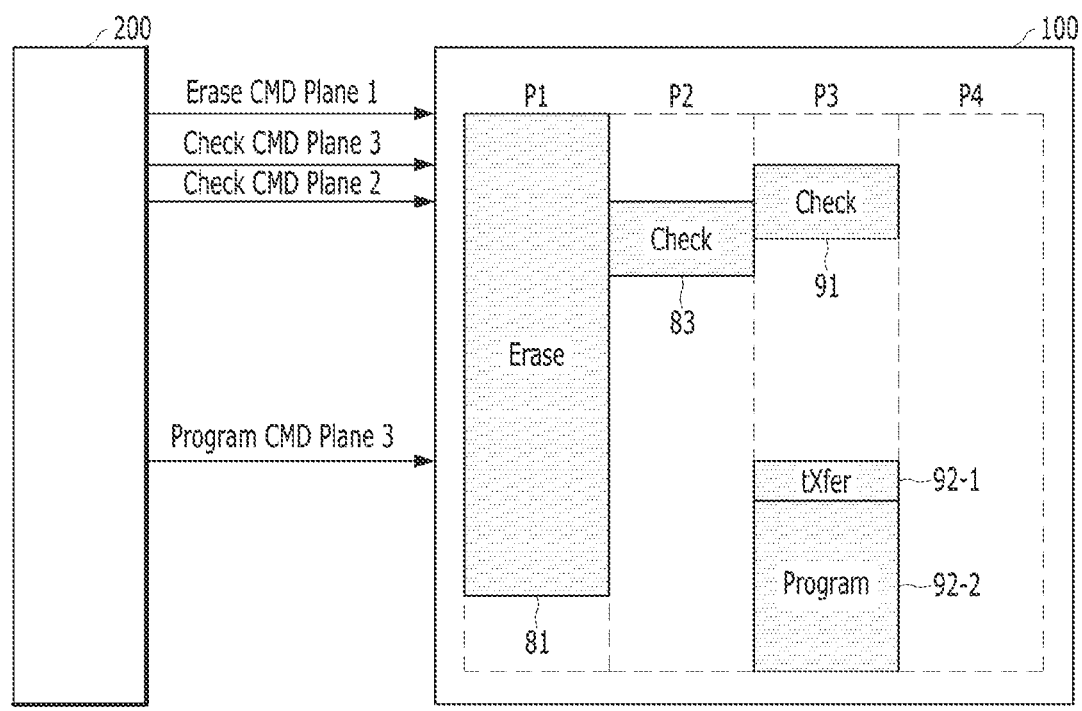
FIG. 13 is a diagram for describing an internal operation of a memory device according to another embodiment of the present disclosure.

FIG. 13 is a diagram for describing internal operations performed in a memory device according to another embodiment of the present disclosure.

Referring to FIG. 13, the controller 200 can transmit an erase command (Erase CMD Plane1) for an erase operation to be performed in the first plane P1 into the memory device 100. The controller 200 can transfer other commands (Check CMD Plane 3, Check CMD Plane 2) for check operations to be performed in the third plane P3 and the second plane P2 and another command (Program CMD Plane 3) for a program operation to be performed in the third plane P3, sequentially.

While the erase operation 81 is performed in the first plane P1, the memory device 100 may perform operations, which correspond to other commands, in the second to fourth planes P2, P3, P4. Based on the commands (Check CMD Plane 3, Check CMD Plane 2) for check operations to be performed in the third plane P3 and the second plane P2, the memory device 100 can perform check operations 91, 83 in the third plane P3 and the second plane P2, while the erase operation 81 is performed in the first plane P1. Also, after the check operations 91, 83 in the third plane P3 and the second plane P2 are completed, the third plane P3 and the second plane P2 could be ready for performing another operation. In response to the command (Program CMD Plane 3) for a program operation to be performed in the third plane P3, which is input later than the commands (Check CMD Plane 3, Check CMD Plane 2) for the check operations, the memory device 100 can receive a data item through a data transfer operation 92-1, and perform a program operation 92-2 in the third plane P3.

Referring to FIGS. 9 to 13, while an erase operation is performed in the first plane P1 of the memory device 100, a check operation, a program operation, a read operation, and/or potential additional operations can be performed in other planes P2, P3, P4 in the same memory device 100. According to an embodiment, for achieving multiple operations in an interleaving operation mode, the controller 200 can schedule the multiple operations to be performed in each of the planes P1, P2, P3, P4, or change or adjust a sequence or a timing of transferring multiple commands corresponding to the multiple operations. In another embodiment, a control circuit included in the memory device 100 can receive multiple commands transmitted from the controller 200 and store the multiple commands in a buffer. The control circuit can adjust or change a sequence of operations corresponding to the multiple commands so that the operations can be executed in an adjusted or changed sequence, rather than the input sequence, over each of the planes P1, P2, P3, P4 in the memory device 100.

According to an embodiment of the disclosure, a non-volatile semiconductor device can include a plurality of planes supporting an interleaving operation mode. While performing an erase operation for erasing data items of a memory block included in one of the plurality of planes, a memory device can perform a check operation for checking an operation state of a memory block included in another plane or perform an operation to read a data item, thereby improving performance of the memory device.

While the present teachings have been illustrated and described with respect to specific embodiments, it will be apparent to those skilled in the art in light of the present disclosure that various changes and modifications may be made without departing from the spirit and scope of the disclosure as defined in the following claims. Furthermore, embodiments may be combined to form additional embodiments

What is claimed is:
1. A memory system, comprising:
a first memory die including multiple planes each including a plurality of memory cells; and
a controller configured to perform data communication with the first memory die through a first channel, and transfer at least two commands from among commands for an erase operation, a read operation, a program operation, and a check operation to the first memory die,
wherein the controller is configured to, after transferring an erase command to a plane among the multiple planes, transfer a read command, a program command, or a check command to another plane among the multiple planes while the first memory die performs an erase operation corresponding to the erase command in the plane, and
wherein the controller is configured to estimate an operation margin of the erase operation performed in the plane and adjust or change a sequence of the read command, the program command, and the check command to be transferred to the another plane.

2. The memory system of claim 1, further comprising:
a second memory die, coupled to the controller via a second channel, the second memory die including multiple other planes,
wherein the controller is configured to divide multiple commands performed in the first memory die and the second memory die into different groups corresponding to the first memory die and the second memory die.

3. The memory system of claim 1, wherein the first memory die comprises:
- a voltage generator configured to generate voltages used in the multiple planes;
- a data buffer and distributor configured to distribute and transfer data input or output via the first channel over the multiple planes via data lines coupled to the multiple planes; and
- a control circuit configured to control the voltage generator and the data buffer and distributor and output a result of an operation performed in the multiple planes.

4. The memory system of claim 3, wherein the data buffer and distributor comprise multiple buffers, each buffer corresponding to each of the multiple planes.

5. The memory system of claim 3, wherein the control circuit is capable of changing or adjusting an execution sequence of commands input from the controller, to prevent another erase operation from being performed in other planes among the multiple planes while the first memory die performs the erase operation corresponding to the erase command in the plane.

6. A memory system, comprising:
- a first memory die including multiple first planes each including a plurality of first memory cells;
- a second memory die including multiple second planes each including a plurality of second memory cells; and
- a controller configured to perform data communication with the first and second memory dies through first and second channels,
- wherein the controller is configured to transfer at least two commands from among commands for an erase operation, a read operation, a program operation, and a check operation to be performed in the first and second memory dies, and
- wherein the first memory die is configured to, while performing an erase operation in a plane of the multiple first planes based on commands input from the controller, perform a read operation, a program operation or a check operation in other planes of the multiple first planes based on the commands, and
- wherein the controller is configured to estimate an operation margin of the erase operation performed in the plane and adjust or change a sequence of the read command, the program command, and the check command to be transferred to the other planes.

7. The memory system of claim 6, wherein the second memory die is configured to, while performing an erase operation in a plane of the multiple second planes based on other commands input from the controller, perform a read operation, a program operation, or a check operation in other planes of the multiple second planes based on the other commands.

8. The memory system of claim 6, wherein the first memory die comprises:
- a voltage generator configured to generate voltages used in the multiple first planes;
- a data buffer and distributor configured to distribute and transfer data input or output via the first channel over the multiple first planes via data lines coupled to the multiple first planes; and
- a control circuit configured to control the voltage generator and the data buffer and distributor and output a result of an operation performed in the multiple first planes.

9. The memory system of claim 8, wherein the data buffer and distributor comprise multiple buffers each corresponding to a plane of the multiple first planes.

10. The memory system of claim 8, wherein the control circuit is capable of changing or adjusting an execution sequence of the commands input from the controller, to prevent another erase operation from being performed in other planes among the multiple first planes while the first memory die performs the erase operation corresponding to the erase command in the plane among the multiple first planes.

11. A memory device, comprising:
- a plurality of non-volatile memory cells divided into multiple groups;
- a control circuit configured to change or adjust an execution sequence of an erase operation, a program operation, a read operation, and a check operation performed on the plurality of non-volatile memory cells, and, while performing an erase operation in a group of the multiple groups, perform a read operation, a program operation, or a check operation in other groups of the multiple groups, and
- multiple data buffers and multiple command buffers, each data buffer and each command buffer corresponding to a group of the multiple groups,
- wherein the control circuit is configured to control input or output of the multiple data buffers and the multiple command buffers to change or adjust the execution sequence, and
- wherein the control circuit is configured to, when a command output from a command buffer among the multiple command buffers is an erase command, check whether an operation performed in the multiple groups is an erase operation to determine whether an operation corresponding to the command is executed.

12. The memory device of claim 11, wherein the plurality of non-volatile memory cells and the control circuit are implemented in a single semiconductor chip.

13. The memory device of claim 11, wherein the plurality of non-volatile memory cells and the control circuit are implemented in different semiconductor chips.

14. The memory device of claim 11, wherein the multiple data buffers and the multiple command buffers have a first-in, first-out (FIFO) data structure.

15. The memory device of claim 11, wherein the control circuit is configured to, when transmitting or receiving a data buffer among the multiple data buffers, obstruct data transmission/reception in other data buffers among the multiple data buffers.

16. The memory device of claim 11, wherein the control circuit is configured to change or adjust the execution sequence according to whether data transmission/reception is required for operations performed in the multiple groups.

* * * * *